(12) United States Patent
Ray et al.

(10) Patent No.: US 7,972,031 B2
(45) Date of Patent: Jul. 5, 2011

(54) ADDRESSABLE OR STATIC LIGHT EMITTING OR ELECTRONIC APPARATUS

(75) Inventors: William Johnstone Ray, Fountain Hills, AZ (US); Mark David Lowenthal, Gilbert, AZ (US)

(73) Assignee: NthDegree Technologies Worldwide Inc, Tempe, AZ (US)

( * ) Notice: Subject to any disclaimer, the term of this patent is extended or adjusted under 35 U.S.C. 154(b) by 249 days.

(21) Appl. No.: 11/756,619

(22) Filed: May 31, 2007

(65) Prior Publication Data

US 2008/0297071 A1     Dec. 4, 2008

(51) Int. Cl.
F21S 4/00      (2006.01)

(52) U.S. Cl. .............. 362/249.02; 361/772; 174/261; 257/99; 345/82

(58) Field of Classification Search .......... 362/252, 362/249; 345/46, 82; 257/97–103; 200/177; 361/772, 775, 777, 778; 174/260–268
See application file for complete search history.

(56) References Cited

U.S. PATENT DOCUMENTS

| | | | |
|---|---|---|---|
| 5,793,455 A | 8/1998 | Nakamura | |
| 6,107,671 A * | 8/2000 | Onodera | .............. 257/536 |
| 6,331,063 B1 * | 12/2001 | Kamada et al. | .............. 362/237 |
| 6,407,763 B1 | 6/2002 | Yamaguchi et al. | |
| 6,864,875 B2 | 3/2005 | Drzaic et al. | |
| 7,095,477 B2 | 8/2006 | Liang et al. | |
| 7,218,048 B2 | 5/2007 | Choi et al. | |
| 2001/0046652 A1 * | 11/2001 | Ostler et al. | .............. 433/29 |
| 2004/0195576 A1 * | 10/2004 | Watanabe et al. | .............. 257/79 |
| 2004/0218388 A1 * | 11/2004 | Suzuki | .............. 362/231 |
| 2005/0087131 A1 | 4/2005 | Shtein et al. | |
| 2006/0001055 A1 | 1/2006 | Ueno et al. | |
| 2006/0105481 A1 * | 5/2006 | Boardman et al. | .............. 438/22 |
| 2006/0277778 A1 | 12/2006 | Mick et al. | |
| 2006/0281341 A1 | 12/2006 | Soeta | |
| 2007/0035808 A1 | 2/2007 | Amundson et al. | |
| 2007/0040489 A1 | 2/2007 | Ray et al. | |
| 2007/0111354 A1 | 5/2007 | Seong et al. | |

* cited by examiner

*Primary Examiner* — Julie A Shallenberger

(74) *Attorney, Agent, or Firm* — Nancy R. Gamburd; Gamburd Law Group LLC

(57) ABSTRACT

The present invention provides an addressable or static electronic apparatus, such as a light emitting display. An exemplary apparatus comprises a substrate having a plurality of cavities; a plurality of first conductors coupled to the substrate and at least partially within the cavities, with the plurality of first conductors having a first and substantially parallel orientation; a plurality of light emitting diodes or other electronic components coupled to the plurality of first conductors and having a second orientation substantially normal to the first orientation; and a plurality of substantially optically transmissive second conductors coupled to the plurality of light emitting diodes and having a third orientation substantially normal to the second orientation and substantially perpendicular to the first orientation. In an exemplary method, the plurality of electronic components in a suspending medium are deposited within the plurality of cavities, and the plurality of electronic components are oriented using an applied field, followed by a bonding of the plurality of electronic components to the plurality of first conductors.

44 Claims, 19 Drawing Sheets

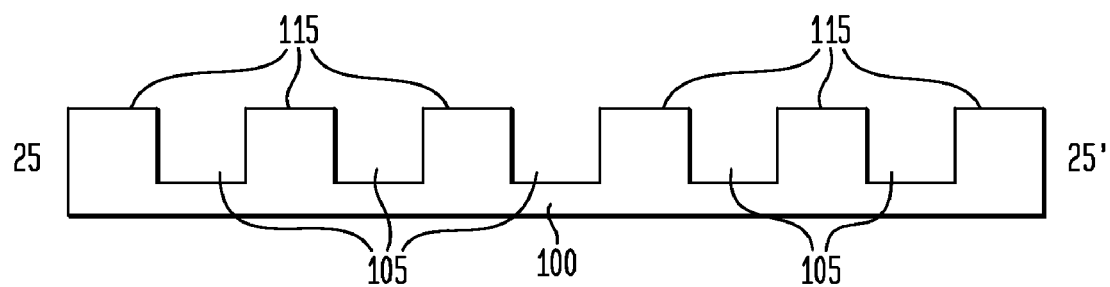
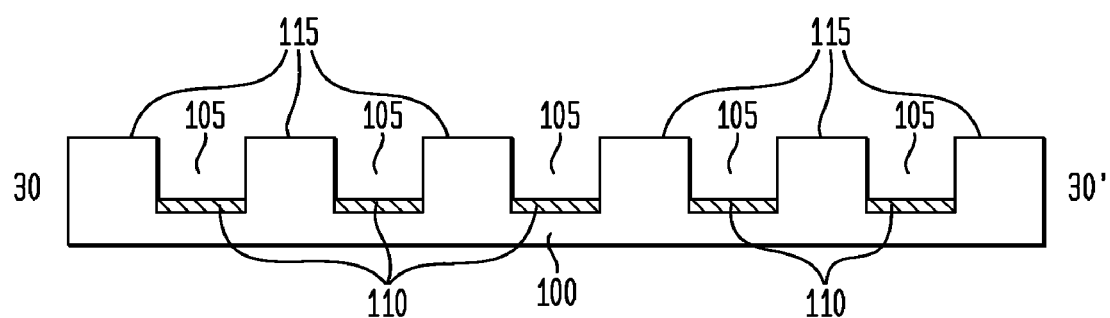
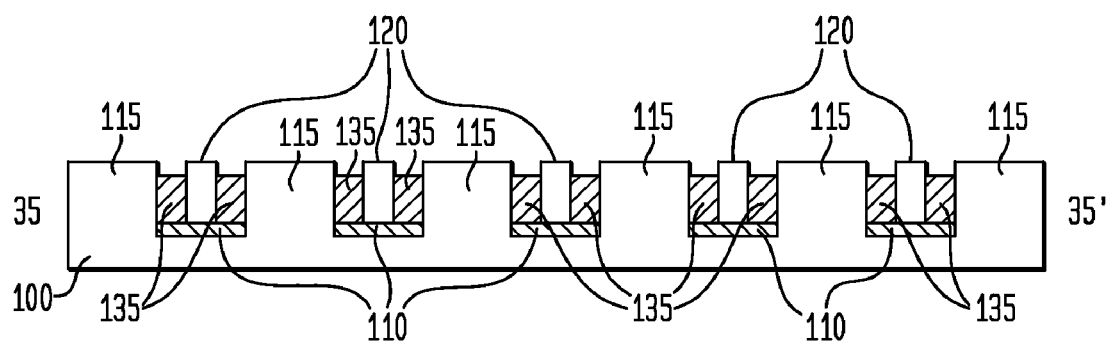

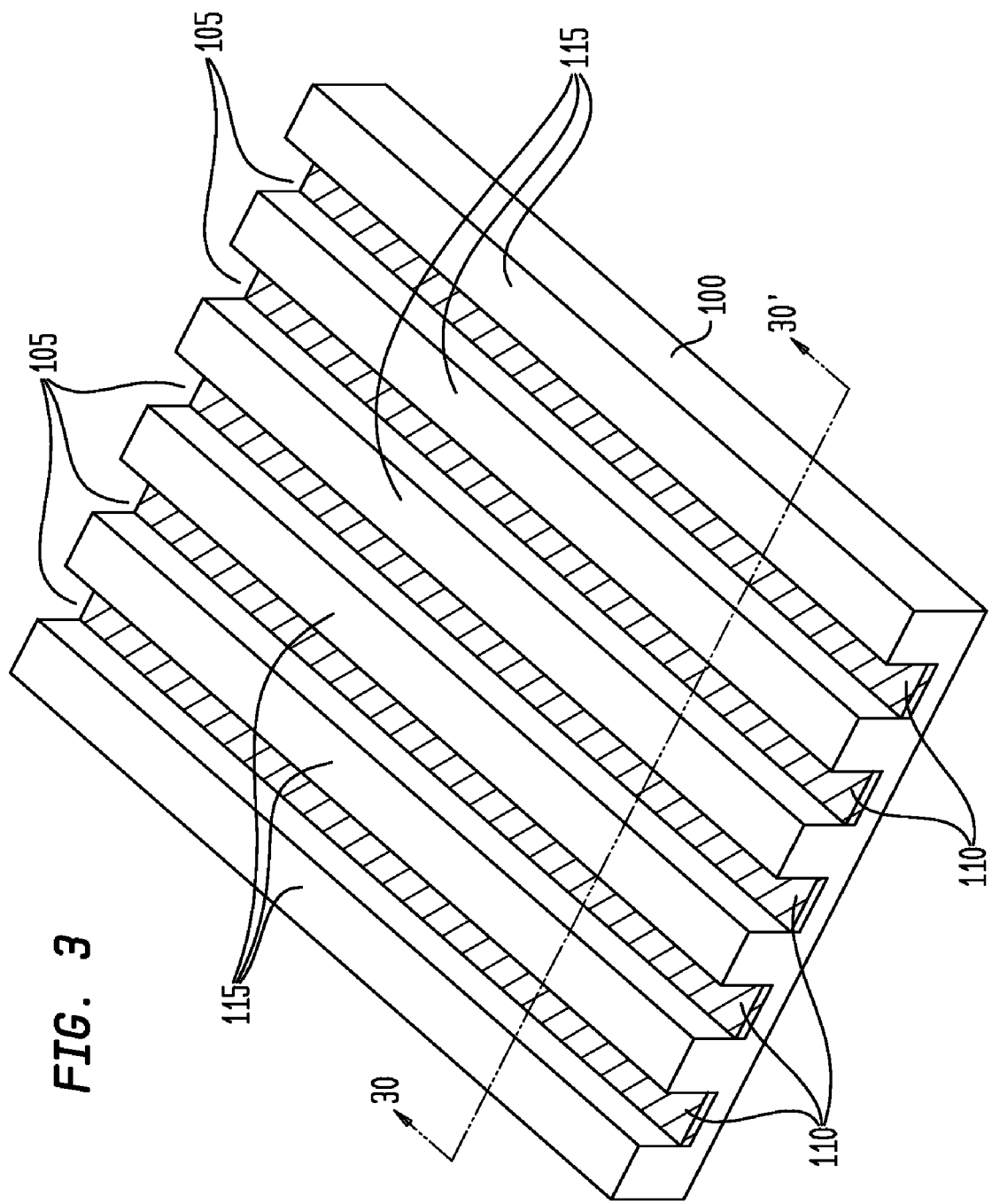

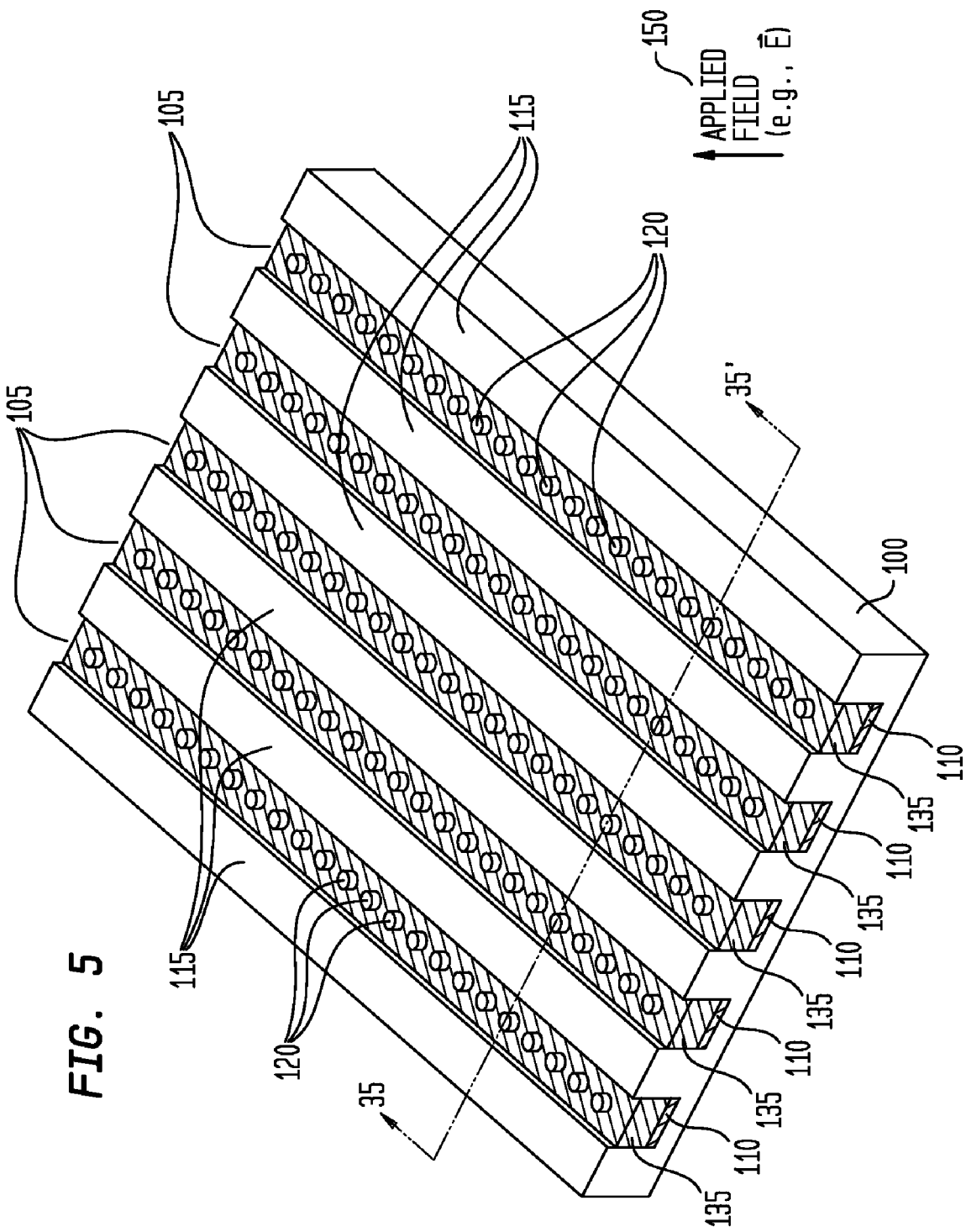

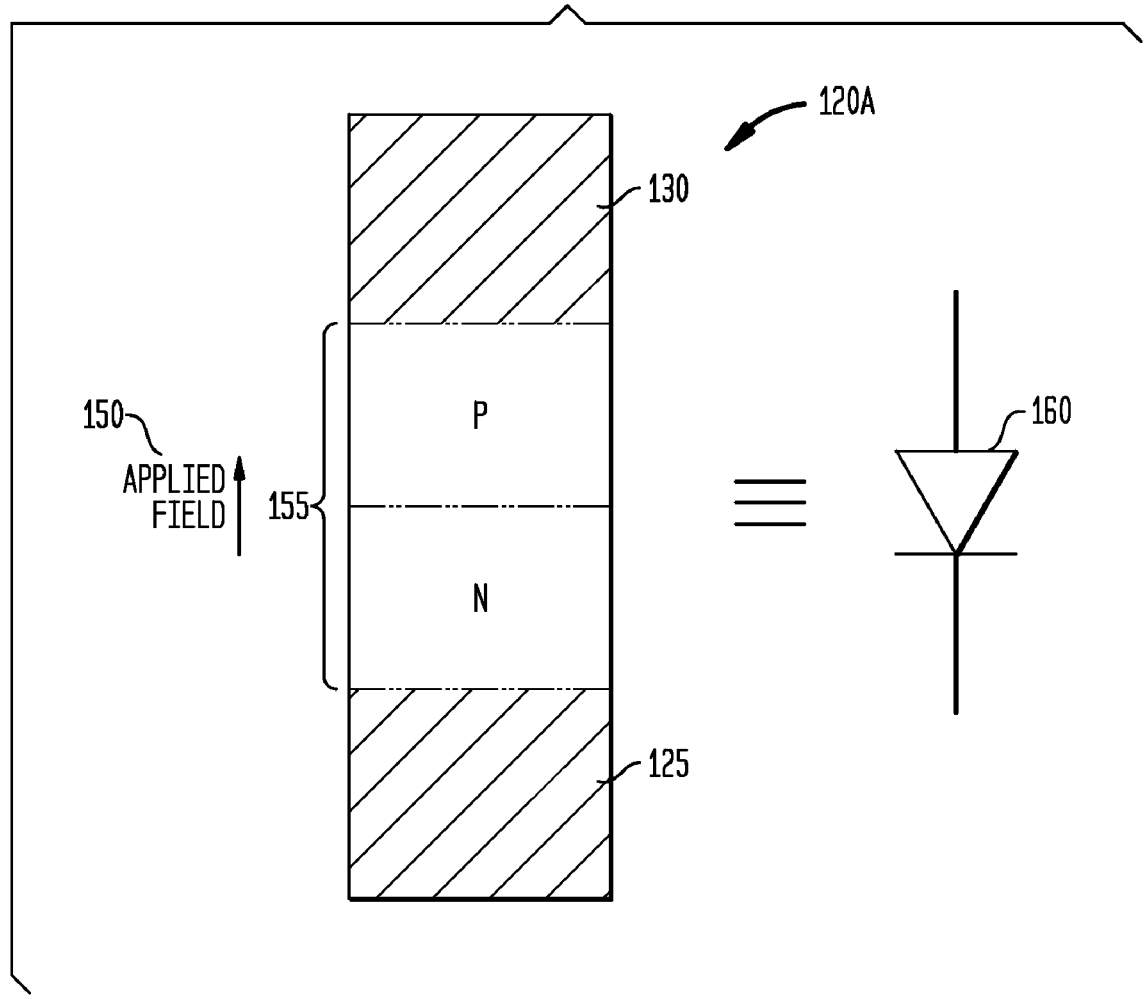

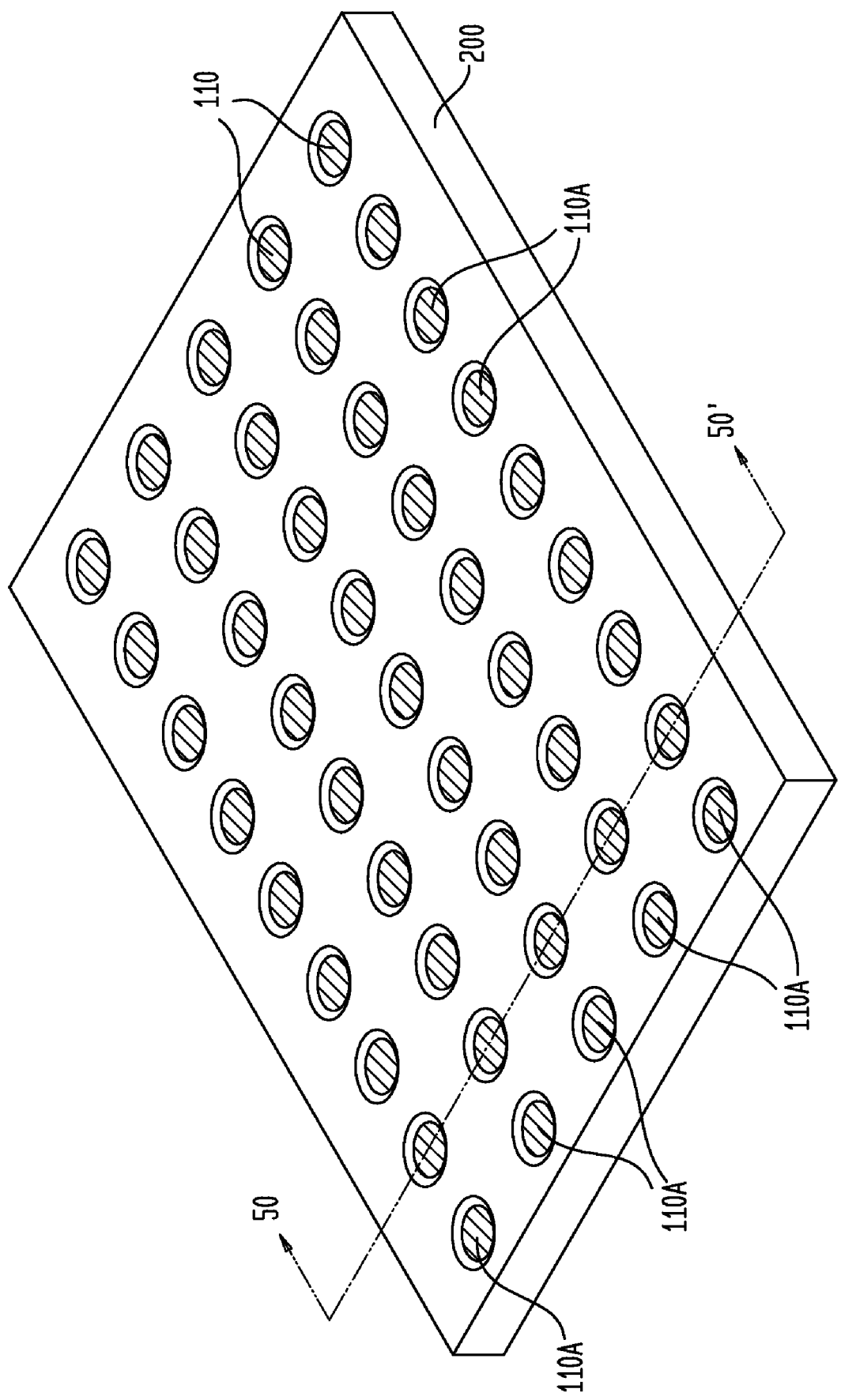

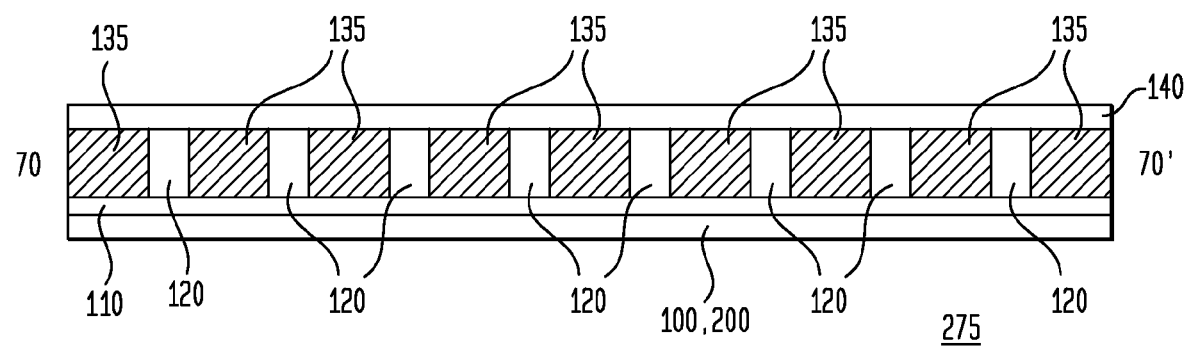
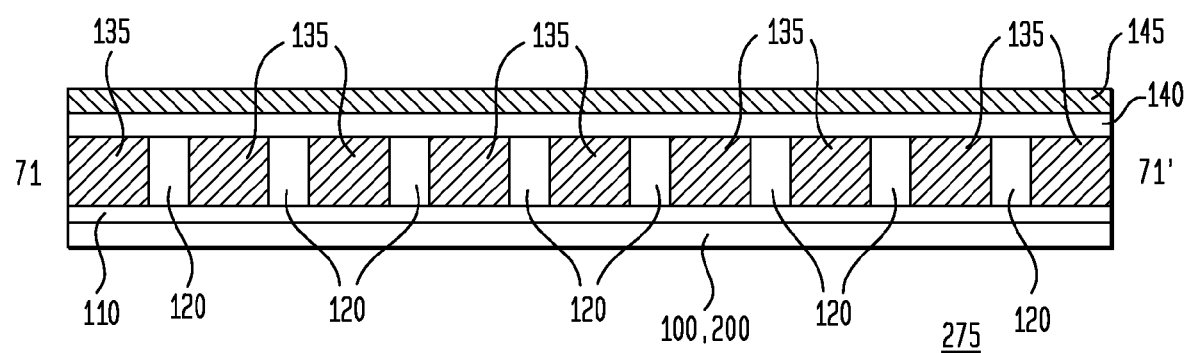

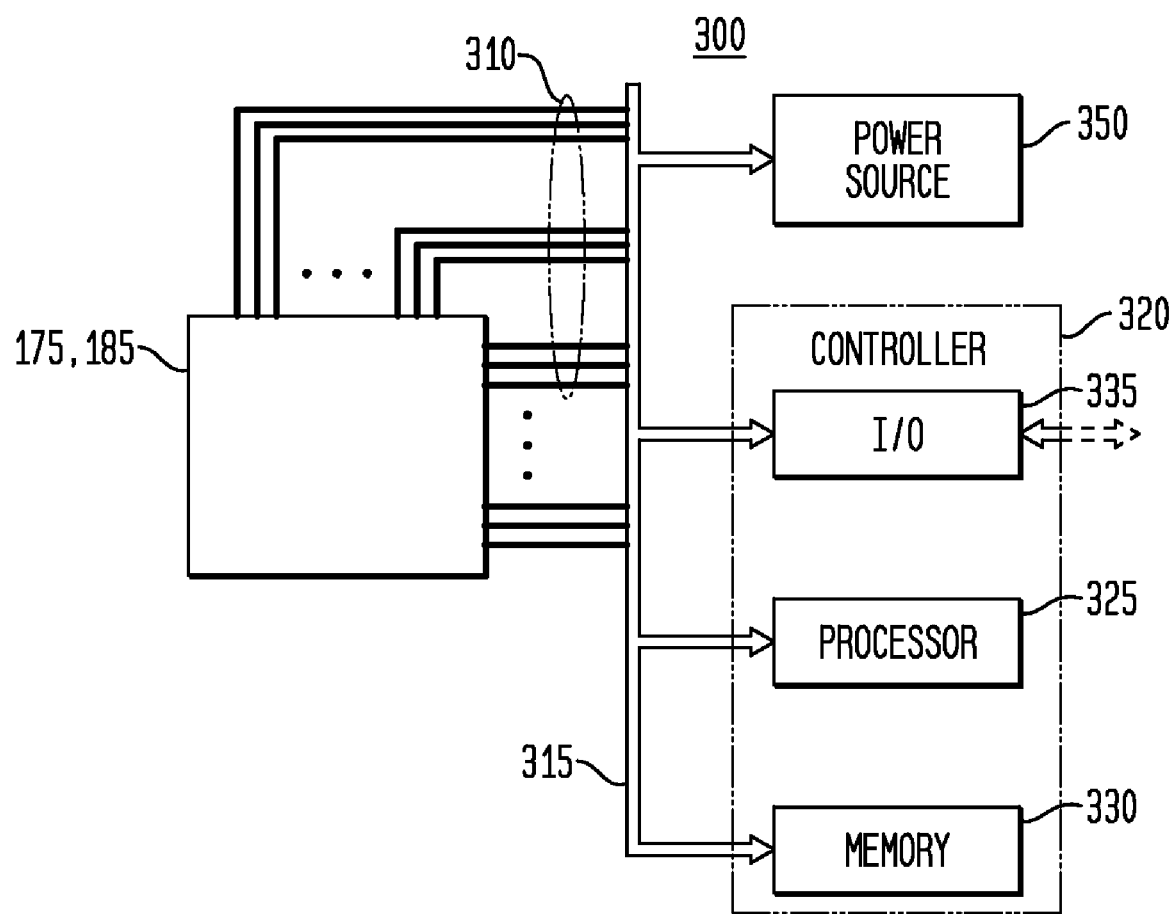

ADDRESSABLE OR STATIC LIGHT EMITTING OR ELECTRONIC APPARATUS

FIELD OF THE INVENTION

The present invention in general is related to electronic display technology and, in particular, is related to an electronic display technology capable of being printed or coated on a wide variety of substrates, and which further may be electronically addressable in various forms for real-time display of information.

BACKGROUND OF THE INVENTION

Display technologies have included television cathode ray tubes, plasma displays, and various forms of flat panel displays. Typical television cathode ray tube displays utilize an emissive coating, typically referred to as a "phosphor" on an interior, front surface, which is energized from a scanning electron beam, generally in a pattern referred to as a raster scan. Such television displays have a large, very deep form factor, making them unsuitable for many purposes.

Other displays frequently used for television, such as plasma displays, while having a comparatively flat form factor, involve a complex array of plasma cells containing a selected gas or gas mixture. Using row and column addressing to select a picture element (or pixel), as these cells are energized, the contained gas is ionized and emits ultraviolet radiation, causing the pixel or subpixel containing a corresponding color phosphor to emit light. Involving myriad gas-containing and phosphor-lined cells, these displays are complicated and expensive to manufacture, also making them unsuitable for many purposes.

Other newer display technologies, such as active and passive matrix liquid crystal displays ("LCDs"), also include such pixel addressability, namely, the capability of individually addressing a selected picture element. Such displays include a complex array of layers of transistors, LCDs, vertically polarizing filters, and horizontally polarizing filters. In such displays, there is often a light source which is always powered on and emitting light, with the light actually transmitted controlled by addressing particular LCDs within an LCD matrix. Such addressing, however, is accomplished through additional layers of transistors, which control the on and off state of a given pixel.

Currently, creation of such displays requires semiconductor fabrication techniques to create the controlling transistors, among other things. A wide variety of technologies are involved to fabricate the liquid crystal layer and various polarizing layers. LCD displays also are complicated and expensive to manufacture and, again, unsuitable for many purposes.

As a consequence, a need remains for a scalable electronic display, which may provide substantially larger form factors, suitable for applications such as outdoor signage. In addition, for various applications, such an electronic display should provide a printable surface, for direct application of an image to be illuminated. Such an electronic display should also provide for significant durability with a capability to withstand typical environmental conditions, especially for outdoor applications or other applications in environments having variable conditions.

A further need remains for a dynamic electronic display which provides for pixel addressability, for the display of dynamically changing information. Such a display further should be capable of fabrication using printing or coating technologies, rather than using complicated and expensive semiconductor fabrication techniques. Such a display should be capable of fabrication in a spectrum of sizes, from a size comparable to a mobile telephone display, to that of a billboard display (or larger). Such a display should also be robust and capable of operating under a wide variety of conditions.

SUMMARY OF THE INVENTION

The exemplary embodiments of the present invention provide a new type of electronic display and a new method of manufacturing such a display, using printing and coating technologies. The inventive electronic display may be regional or static, such as for signage, or which may be addressable, such as for the display of changing information. The inventive display may be fabricated in a wide variety of sizes, from a size comparable to a mobile telephone display, to that of a billboard display (or larger). The exemplary inventive displays are also robust and capable of operating under a wide variety of conditions, including outdoor and other stressful environmental conditions.

In an exemplary embodiment, a method of manufacturing an electronic apparatus is provided. The exemplary method comprises: depositing a first conductive medium on a substrate to form a first conductor; depositing a plurality of electronic components; orienting the plurality of electronic components using an applied field; and depositing a second, optically transmissive conductive medium.

For selected exemplary embodiments, the substrate has a plurality of cavities, which may be integrally molded in the substrate. For various applications, the substrate may be embossed. For these embodiments, the step of depositing the first conductive medium further comprises depositing the first conductive medium in the plurality of cavities to form a plurality of first conductors. The plurality of cavities may be at least one of the following types of cavities: channels, grooves, or substantially hemispherically-shaped depressions or bores. The step of depositing the second conductive medium may also further comprise depositing the second conductive medium to form a plurality of second conductors. The exemplary method may also further comprise depositing a third conductive medium over or within the plurality of second conductors.

Also for selected exemplary embodiments, the step of depositing the first conductive medium further comprises coating the plurality of cavities with the first conductive medium and removing excess first conductive medium by scraping a surface of the substrate using a doctor blade. Similarly, the step of depositing the plurality of electronic components further comprises coating the plurality of cavities with the plurality of electronic components and removing excess plurality of electronic components by scraping a surface of the substrate using a doctor blade.

In an exemplary embodiment, the plurality of electronic components are suspended in a binding medium, which may be cured while the plurality of electronic components are oriented by the applied field. Typically, the cured binding medium has a dielectric constant greater than about one, to provide at least some degree of electrical insulation for a selected application. Exemplary curing steps include (1) curing the binding medium using a substantially uniform and substantially constant applied electromagnetic field; (2) curing the binding medium using an applied ultraviolet electromagnetic field; and/or (3) curing the binding medium using an applied visible spectrum electromagnetic field.

In another exemplary embodiment, the plurality of electronic components are suspended in a solvent. For this embodiment, the exemplary method further comprises evaporating the solvent; and binding the plurality of electronic components to the plurality of first conductors while the plurality of electronic components are oriented by the applied field.

For selected embodiments, the exemplary method may further comprise bonding the plurality of electronic components to the first conductor, such as by abutment to or within the first conductor, or by annealing the plurality of electronic components to the first conductor.

In an exemplary embodiment, the first conductive medium is a conductive ink, which may be cured using applied ultraviolet radiation or applied heat. Also in an exemplary embodiment, the second conducting medium is an optically transmissive polymer.

The applied field may be an electric field, a magnetic field, or an electromagnetic field, for example. In addition, the exemplary method may further comprise applying a sonic field subsequent to or during the deposition of the plurality of electronic components, or vibrating the substrate subsequent to or during the deposition of the plurality of electronic components.

In an exemplary embodiment, the deposition steps further comprise at least one of the following types of deposition: printing, coating, rolling, spraying, layering, sputtering, lamination, screen printing, inkjet printing, electro-optical printing, electroink printing, photoresist printing, thermal printing, laser jet printing, magnetic printing, pad printing, flexographic printing, hybrid offset lithography, Gravure printing, and/or printing.

In another exemplary embodiment, the second, optically transmissive conductive medium forms a second conductor and the exemplary method further comprises depositing a third conductive medium over or within the second conductor.

The plurality of electronic components may be light emitting diodes or transistors, for example. The electronic apparatus may be an addressable light emitting diode display, a static or regionally-addressable light emitting diode display, or a lighting apparatus, for example.

In another exemplary embodiment, a method of manufacturing an electronic apparatus comprises: depositing a first conductive medium within a plurality of cavities of a substrate to form a plurality of first conductors; depositing a plurality of electronic components within the plurality of cavities; orienting the plurality of electronic components using an applied field; and depositing a second, optically transmissive conductive medium to form a plurality of second conductors.

In yet another exemplary embodiment, a method of manufacturing an addressable light emitting display comprises: depositing a first conductive medium within a plurality of cavities of a substrate to form a plurality of first conductors; curing the first conductive medium using applied ultraviolet radiation or applied heat; depositing a plurality of light emitting electronic components within the plurality of cavities, the plurality of light emitting electronic components suspended in a binding medium; orienting the plurality of light emitting electronic components using an applied field; bonding the plurality of light emitting electronic components to the plurality of first conductors; curing the binding medium while the plurality of light emitting electronic components are oriented by the applied field; depositing a second, optically transmissive conductive medium to form a plurality of second conductors coupled to the plurality of light emitting electronic components; and depositing a third conductive medium over or within the plurality of second conductors.

In yet another exemplary embodiment, an addressable light emitting apparatus comprises: a substrate having a plurality of cavities; a plurality of first conductors coupled to the substrate and at least partially within the cavities, the plurality of first conductors having a first and substantially parallel orientation; a plurality of light emitting diodes coupled to the plurality of first conductors and having a second orientation substantially normal to the first orientation; and a plurality of substantially optically transmissive second conductors coupled to the plurality of light emitting diodes and having a third orientation substantially normal to the second orientation and substantially perpendicular to the first orientation. In addition, a plurality of third conductors may be coupled to the plurality of second conductors and having the third orientation. A cured, optically transmissive and electrically insulating material may be coupled to each of the plurality of light emitting diodes.

The substrate may be substantially flat and have a thickness of less than two millimeters. For example, the substrate may comprise at least one of the following types of substrates: paper, coated paper, plastic coated paper, embossed paper, fiber paper, cardboard, poster paper, poster board, wood, plastic, rubber, fabric, glass, ceramic, concrete, or stone.

The plurality of cavities may be substantially elongated and have the first orientation. Alternatively, the plurality of cavities may be substantially and partially hemispherically-shaped and are disposed in an array. For this latter embodiment, the plurality of first conductors may further comprise a first portion substantially disposed within the plurality of cavities; and a second portion substantially elongated and disposed in the first orientation.

In an exemplary embodiment, the plurality of first conductors may comprise a cured conductive ink or a cured conductive polymer. For example, the plurality of first conductors may comprise at least one of the following types of conductors in a cured form: a silver conductive ink, a copper conductive ink, a gold conductive ink, an aluminum conductive ink, a tin conductive ink, a carbon conductive ink, or a conductive polymer. Similarly, the plurality of second conductors may comprise an optically transmissive polymer. For example, the plurality of second conductors may comprise at least one of the following types of optically transmissive polymers: antimony tin oxide, indium tin oxide, or polyethylene-dioxithiophene.

In various exemplary embodiments, the plurality of light emitting diodes may be coupled to or within the plurality of first conductors by abutment, or may be annealed to or within the plurality of first conductors. In addition, the plurality of first conductors, the plurality of light emitting diodes and the plurality of second conductors may be deposited through a printing process.

In yet another exemplary embodiment, an addressable apparatus comprises: a substrate having a plurality of cavities; a plurality of first conductors coupled to the substrate and at least partially within the cavities, the plurality of first conductors having a first and substantially parallel orientation; a plurality of electronic components coupled to the plurality of first conductors and having a second orientation substantially normal to the first orientation; and a plurality of second conductors coupled to the plurality of electronic components and having a third orientation substantially normal to the second orientation and substantially perpendicular to the first orientation.

In yet another exemplary embodiment, a light emitting apparatus comprises: a substrate; a first conductor coupled to the substrate to form a singular, first conductive layer having a first and substantially flat orientation; a plurality of light emitting diodes coupled to the first conductor and having a second orientation substantially normal to the first orientation; and a substantially optically transmissive second conductor coupled to the plurality of light emitting diodes to form a singular, second conductive layer having the first and substantially flat orientation.

In such an exemplary embodiment, the substrate may have a plurality of cavities which are substantially elongated and substantially parallel within the first orientation, or the substrate may have a plurality of cavities which are substantially and partially hemispherically-shaped and are disposed in an array. The first conductor may also further comprise a plurality of first conductors, each of the first conductors having a first portion substantially disposed within the plurality of cavities; and a second portion substantially elongated and substantially parallel within the first orientation. In another embodiment, the first conductor may further comprise a plurality of substantially parallel first conductors, and the second conductor may further comprises a plurality of second conductors, each of the second conductors substantially parallel and substantially perpendicular to the plurality of first conductors.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which:

FIG. 2 is a cross-sectional view of the first exemplary substrate 100 for an apparatus embodiment in accordance with the teachings of the present invention.

FIG. 3 is a perspective view of a first exemplary substrate with a plurality of first conductors having been deposited for an apparatus embodiment in accordance with the teachings of the present invention.

FIG. 4 is a cross-sectional view of the first exemplary substrate with a plurality of first conductors for an apparatus embodiment in accordance with the teachings of the present invention.

FIG. 5 is a perspective view of a first exemplary substrate 100 with a plurality of first conductors and a plurality of electronic components having been deposited for an apparatus embodiment in accordance with the teachings of the present invention.

FIG. 6 is a cross-sectional view of the first exemplary substrate with a plurality of first conductors and a plurality of electronic components having been deposited for an apparatus embodiment in accordance with the teachings of the present invention.

FIG. 7 is a cross-sectional view with an electronic equivalent circuit element of an exemplary electronic components oriented in an applied field for an apparatus embodiment in accordance with the teachings of the present invention.

FIG. 10 is a perspective view of a second exemplary substrate 200 with a plurality of first conductors having been deposited for an apparatus embodiment in accordance with the teachings of the present invention.

FIG. 27 is a cross-sectional view of a third exemplary apparatus embodiment in accordance with the teachings of the present invention.

FIG. 28 is a cross-sectional view of a third exemplary apparatus embodiment in accordance with the teachings of the present invention.

FIG. 29 is a block diagram illustrating a system embodiment in accordance with the teachings of the present invention.

DETAILED DESCRIPTION OF EXEMPLARY EMBODIMENTS

Figure 1:
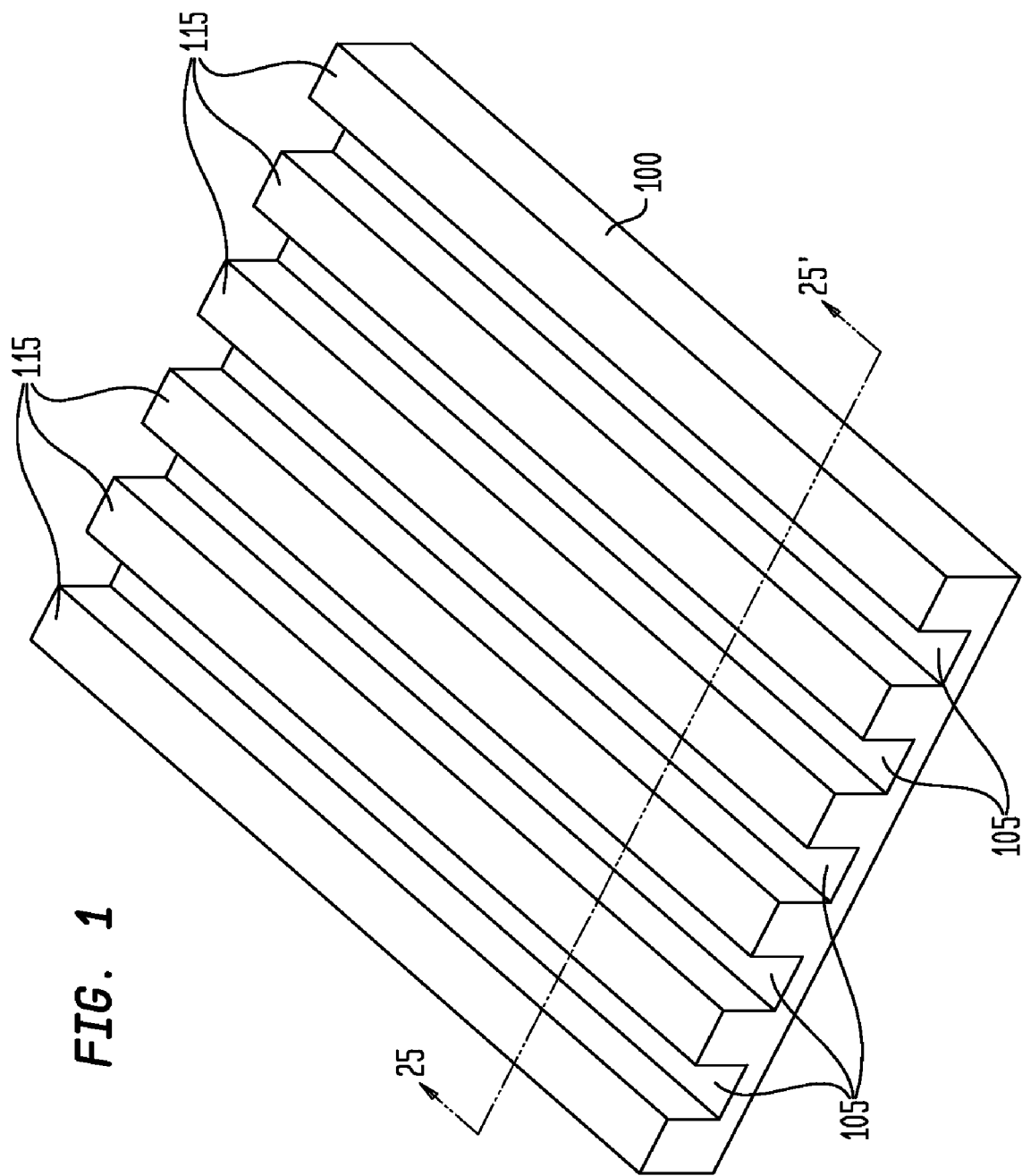
FIG. 1 is a perspective view of a first exemplary substrate 100 for an apparatus embodiment in accordance with the teachings of the present invention.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

For selected embodiments, the invention disclosed herein is related to U.S. patent application Ser. No. 11/023,064, filed Dec. 27, 2004, inventors William Johnstone Ray et al., entitled "Addressable And Printable Emissive Display", to U.S. patent application Ser. No. 11/181,488, filed Jul. 13, 2005, inventors William Johnstone Ray et al., entitled "Addressable And Printable Emissive Display", and to U.S. patent application Ser. No. 11/485,031, filed Jul. 12, 2006, inventors William Johnstone Ray et al., entitled "Static and Addressable Emissive Displays" (the "related applications") which are commonly assigned herewith, the contents of all of which are incorporated herein by reference, and with priority claimed for all commonly disclosed subject matter.

FIG. 1 is a perspective view of a first exemplary substrate 100 for an apparatus embodiment 175, 185 in accordance with the teachings of the present invention. FIG. 2 is a cross-sectional view (through the 25-25' plane) of the first exemplary substrate 100 for an apparatus embodiment 175, 185 in accordance with the teachings of the present invention. It should be noted that any reference to apparatus 175 should be understood to mean and include its variants, and vice-versa, including apparatuses 175A, 175B, 175C, and 175D, discussed below. As illustrated in FIGS. 1 and 2, the substrate 100 includes a plurality of cavities (or voids) 105, which for the selected embodiment, are formed as elongated cavities, effectively forming channels, grooves or slots (or, equivalently, depressions, valleys, bores, openings, gaps, orifices, hollows, slits, or passages). Another cavity 105 embodiment is discussed below with reference to FIG. 8, which illustrates a plurality of cavities 105 which are shaped to be substantially circular or elliptical depressions or bores 205, forming a substrate 200 (which differs from substrate 100 only due to the shape of the cavities 205). Accordingly, any reference herein to cavities 105 or 205 shall be understood to mean and include the other, or any other cavity of any shape or size. The plurality of cavities 105, 205 are spaced-apart, and which will be utilized to shape and define a plurality of first conductors, as discussed below. In addition, the plurality of cavities 105, 205 may also be utilized to define a "holding well" for color selection (e.g., for red, green or blue LEDs 120A, also discussed below). While the cavities or channels 105 are illustrated in FIG. 1 as substantially parallel and oriented in the same direction, those having skill in the art will recognize that innumerable variations are available, including depth and width of the channels, channel orientation (e.g., circular, elliptical, curvilinear, wavy, sinusoidal, triangular, fanciful, artistic, etc.), spacing variations, type of void or cavity (e.g., channel, depression or bore), etc., and all such variations are considered equivalent and within the scope of the present invention. Substrates 100, 200 having additional forms are illustrated and discussed below with reference to FIGS. 8-16, 18, 19, 22-25, 27 and 28.

The substrate 100, 200 may be formed from or comprise any suitable material, such as plastic, paper, cardboard, or coated paper or cardboard, for example and without limitation. In an exemplary embodiment, the substrate 100, 200 comprises an embossed and coated paper or plastic having the plurality of cavities 105, 205 formed integrally therein, such as through a molding process, including an embossed paper or embossed paper board commercially available from Sappi, Ltd., for example. The substrate substrate 100, 200 may comprise, also for example, any one or more of the following: paper, coated paper, plastic coated paper, fiber paper, cardboard, poster paper, poster board, books, magazines, newspapers, wooden boards, plywood, and other paper or wood-based products in any selected form; plastic materials in any selected form (sheets, film, boards, and so on); natural and synthetic rubber materials and products in any selected form; natural and synthetic fabrics in any selected form; glass, ceramic, and other silicon or silica-derived materials and products, in any selected form; concrete (cured), stone, and other building materials and products; or any other product, currently existing or created in the future. In a first exemplary embodiment, a substrate 100, 200 may be selected which provides a degree of electrical insulation (i.e., has a dielectric constant or insulating properties sufficient to provide electrical isolation of the plurality of first conductors 110 deposited or applied on that (first) side of the apparatus 175, and its variants 175A, 175B, 175C, 175D, 275. For example, while a comparatively expensive choice, a silicon wafer also could be utilized as a substrate 100, 200. In other exemplary embodiments, however, a plastic-coated paper product is utilized to form the substrate 100, such as the patent stock and 100 lb. cover stock available from Sappi, Ltd., or similar coated papers from other paper manufacturers such as Mitsubishi Paper Mills, Mead, and other paper products. In additional exemplary embodiments, any type of substrate 100, 200 may be utilized, with additional sealing or encapsulating layers (such as lacquer and vinyl) applied to a surface of the substrate 100, 200, as disclosed in the related applications cited above.

In accordance with the present invention, a plurality of first conductors 110 are then applied or deposited within the corresponding plurality of cavities 105, 205. As discussed in greater detail below, for the plurality of cavities 205, the plurality of first conductors 110 can be deposited in either one step or in two steps, illustrated as plurality of first conductors 110A and 110B. FIG. 3 is a perspective view of a first exemplary substrate 100 with a plurality of first conductors 110 having been deposited for an apparatus embodiment 175, 185 in accordance with the teachings of the present invention. FIG. 4 is a cross-sectional view (through the 30-30' plane) of the first exemplary substrate 100 with a plurality of first conductors 110 for an apparatus 175, 185 embodiment in accordance with the teachings of the present invention. In an exemplary method of manufacturing the exemplary apparatuses 175, 185, 275, a conductive ink (such as a silver (Ag) ink) is printed or otherwise applied to the substrate 100 (or 200), and subsequently cured or partially cured (such as through an ultraviolet (uv) curing process), to form the plurality of first conductors 110 (and also may be utilized to form the plurality of third conductors 145, and also the bus 310, 315 of FIG. 29 and any electrical or other conductive terminations discussed below).

Other conductive inks or materials may also be utilized to form the first conductors 110, third conductors 145, and any other non-transmissive conductors such as bus 310, 315, such as copper, tin, aluminum, gold, noble metals or carbon inks, gels or other liquid or semi-solid materials. In addition, any other printable or coatable conductive substances may be utilized equivalently to form the first conductors 110, third conductors 145 and/or bus 310, 315, and exemplary conductive compounds include: (1) From Conductive Compounds (Londonberry, N.H., USA), AG-500, AG-800 and AG-510 Silver conductive inks, which may also include an additional coating UV-1006S ultraviolet curable dielectric (such as part of a first dielectric layer 125); (2) From DuPont, 7102 Carbon Conductor (if overprinting 5000 Ag), 7105 Carbon Conductor, 5000 Silver Conductor (also for bus 310, 315 of FIG. 29 and any terminations), 7144 Carbon Conductor (with UV Encapsulants), 7152 Carbon Conductor (with 7165 Encapsulant), and 9145 Silver Conductor (also for bus 310, 315 of FIG. 29 and any terminations); (3) From SunPoly, Inc., 128A Silver conductive ink, 129A Silver and Carbon Conductive Ink, 140A Conductive Ink, and 150A Silver Conductive Ink; and (4) From Dow Corning, Inc., PI-2000 Series Highly Conductive Silver Ink. As discussed below, these compounds may also be utilized to form third conductors 145, bus 310, 315, and any other conductive traces or connections. In addition, conductive inks and compounds may be available from a wide variety of other sources.

Conductive polymers may also be utilized to form the plurality of first conductors 110, third conductors 145 and/or bus 310, 315. For example, polyethylene-dioxithiophene may be utilized, such as the polyethylene-dioxithiophene commercially available under the trade name "Orgacon" from Agfa Corp. of Ridgefield Park, N.J., USA. Other conductive polymers, without limitation, which may be utilized equivalently include polyaniline and polypyrrole polymers, for example.

In an exemplary embodiment, an embossed substrate 100 is utilized, such that the substrate 100 has an alternating series of ridges forming (generally smooth) peaks and valleys, generally all having a substantially parallel orientation, respectively illustrated as raised (or non-channel) portions 115 and cavities (e.g., channels) 105. Conductive inks or polymers may then be applied to remain in either the embossed peaks or valleys, and preferably not to remain in both the peaks and valleys for addressable displays, creating a plurality of first conductors 110 which are not only substantially parallel, but which also have a physical separation from each other determined by the embossing. Indeed, when the conductive inks or polymers are applied to the embossed valleys, the corresponding first plurality of conductors 110 are also separated from each other by the embossed peaks, creating a physical and insulated separation in addition to being spaced apart. For example, conductive inks or polymers may be applied to an embossed substrate in its entirety, and then utilizing a "doctor blade", the conductive inks or polymers are removed from all of the peaks, such as by scraping the blade across the surface of the substrate 100, 200 having a coating of a conductive ink, leaving the conductive inks or polymers to form a first plurality of conductors 110 having a substantially parallel orientation. Alternatively, conductive inks or polymers may be applied (using negligible or zero pressure) to the embossed peaks only, such as by tip printing, also leaving the conductive inks or polymers to form a first plurality of conductors having a substantially parallel orientation.

For example, a conductive ink may be coated or otherwise applied in excess over the entire or most of the substrate 100, 200 with the excess conductive ink subsequently removed using a "doctor blade" or other type of scraping as known in the printing arts, followed by uv curing of the conductive ink within the plurality of channels 105. Using such a doctor blade, the conductive ink within the plurality of cavities 105, 205 is allowed to remain in place, with the balance of the conductive ink (such as covering the non-channel portions of the substrate (raised portions 115) being removed by the scraping process, such as due to contact from the doctor blade. Depending upon the type of printing, including the stiffness of the doctor blade and the applied pressure, the conductive ink may form a meniscus within each of the plurality of cavities 105, 205 or may bow upward instead, for example. Those having skill in the electronic or printing arts will recognize innumerable variations in the ways in which the plurality of first conductors 110 may be formed, with all such variations considered equivalent and within the scope of the present invention.

As a consequence, as used herein, "printing" means, refers to and includes any and all printing, coating, rolling, spraying, layering, sputtering, deposition, lamination and/or affixing processes, whether impact or non-impact, currently known or developed in the future, including without limitation screen printing, inkjet printing, electro-optical printing, electroink printing, photoresist and other resist printing, thermal printing, laser jet printing, magnetic printing, pad printing, flexographic printing, hybrid offset lithography, Gravure and other intaglio printing. All such processes are considered printing processes herein, may be utilized equivalently, and are within the scope of the present invention. Also significant, the exemplary printing processes do not require significant manufacturing controls or restrictions. No specific temperatures or pressures are required. No clean room or filtered air is required beyond the standards of known printing processes. For consistency, however, such as for proper alignment (registration) of the various successively applied layers forming the various embodiments, relatively constant temperature (with a possible exception, discussed below) and humidity may be desirable. In addition, the various compounds utilized may be contained within various polymers, binders or other dispersion agents which may be heat-cured or dried, air dried under ambient conditions, or uv cured, for example, and all such variations are within the scope of the present invention.

A particular advantage of use of a substrate 100, 200 having a plurality of cavities 105, 205 is that printing registration is not required to be exact, and a one-dimensional or relative registration may be sufficient for the successive applications of the different materials and layers forming the apparatus 175, 185, 275.

Figure 19:
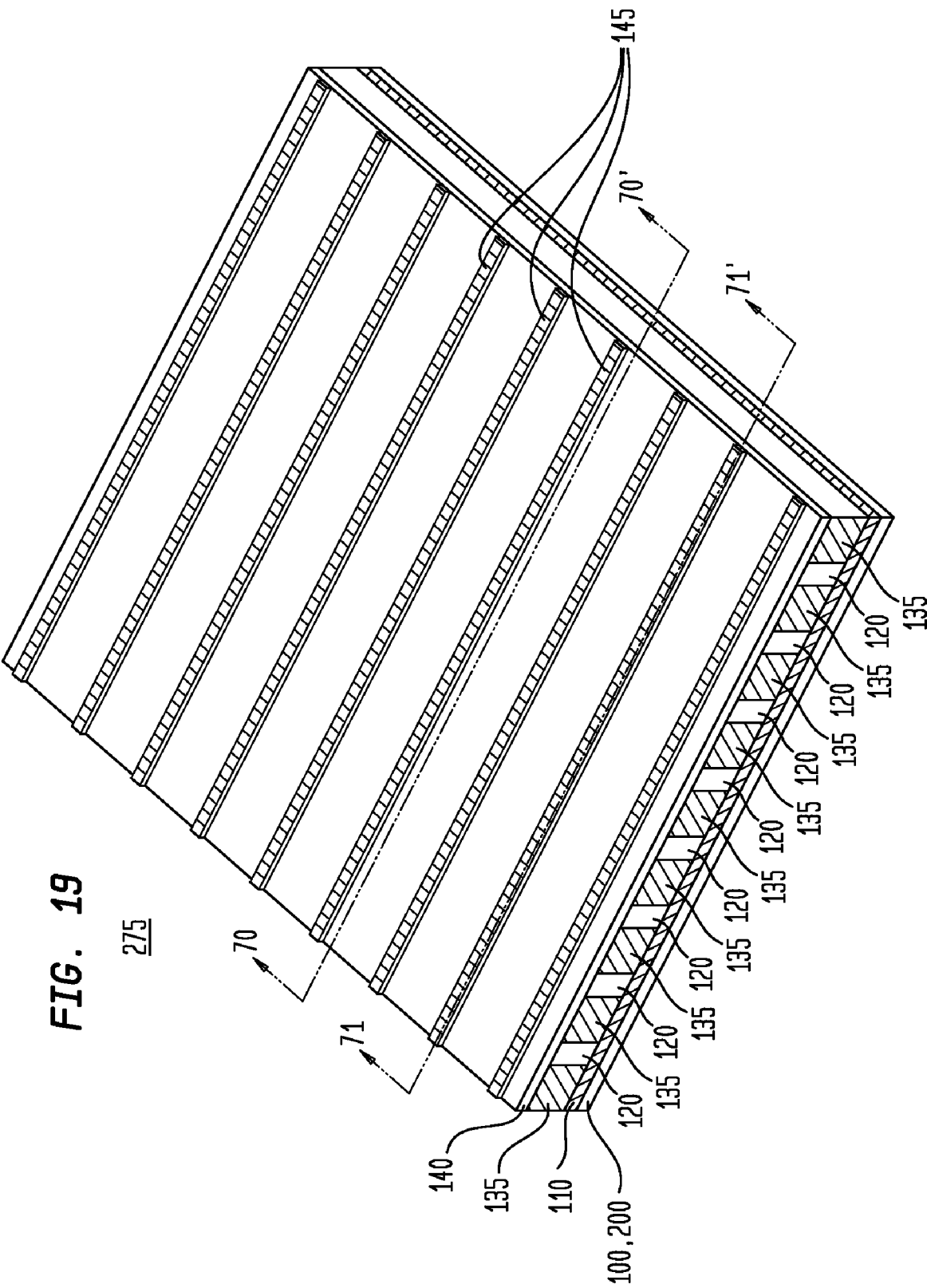
FIG. 19 is a perspective view of a third exemplary apparatus embodiment in accordance with the teachings of the present invention.

It should be noted that depending upon the selected embodiment, the substrate 100, 200 may have a substantially flat, smooth or even surface, without a plurality of cavities 105, 205. For example, when a static display apparatus 275 is formed, a substrate 100, 200 may be utilized which has a substantially flat, smooth or even surface, and one or more first conductors 110 may also be deposited as one electrode or as one or more separate electrodes (which also may be substantially flat), as a capability or adaptability for separate addressing of a plurality of first conductors 110 would not be required. As discussed in greater detail below, the resulting apparatus is highly useful for applications such as lighting or static displays. Such an apparatus 275 embodiment is illustrated in FIG. 19, with corresponding cross-sections illustrated in FIGS. 27 and 28.

Following deposition of the plurality of first conductors 110, the material (such as a conductive ink or polymer) may be cured or partially cured, to form a solid or semi-solid. In other embodiments, the plurality of first conductors 110 may remain in a liquid form and cured subsequently. Following the deposition of the plurality of first conductors 110, with any such curing, partial curing, or non-curing, a suspension of a plurality of electronic components 120 (e.g., light-emitting diodes ("LEDs") 120A or transistors 120B) in an insulating binder 135 is applied over the plurality of first conductors 110, and the plurality of electronic components 120 are then oriented using an applied field 150, such as an electrical or magnetic field, for example. In an exemplary embodiment, a sonic field is also applied at least partially concurrently with the application of a substantially uniform electrical field. The sonic field is utilized to provide some mechanical vibration to the plurality of electronic components 120, to reduce potentially any inertia of the plurality of electronic components 120 and possibly aid in their orientation by the applied electrical or magnetic field; in other embodiments, other means or forms of vibration or inertial reduction may be utilized equivalently.

The suspension of a plurality of electronic components 120 in an insulating binder 135 may be applied, for example, through a printing or coating process, such as by printing within the plurality of cavities 105, 205 having the plurality of first conductors 110. Also for example, the suspension of a plurality of electronic components 120 in an insulating binder 135 may be coated over the substrate and plurality of first conductors 110, with any excess removed using a doctor blade or other scraping process. In an exemplary apparatus 175, 185, 275 embodiment, the plurality of electronic components 120 are oriented (via an applied field 150) to be substantially perpendicular to the plane of the substrate 100, 200. FIG. 5 is a perspective view and FIG. 6 is a cross-sectional view (through the 35-35' plane) of a first exemplary substrate 100 with a plurality of first conductors 110 and a plurality of electronic components 120 having been deposited in an insulating binder 135 and oriented in an applied field 150 for an apparatus 175, 185, 275 embodiment in accordance with the teachings of the present invention.

FIG. 7 is a simplified cross-sectional view with an electronic equivalent circuit element 160 of an exemplary electronic component 120, illustrated as a diode 120A, oriented in an applied field 150 for an apparatus 175, 185 embodiment in accordance with the teachings of the present invention. As illustrated, the diode 120A comprises a pn junction 155 which, due to its dopant composition, has an intrinsic voltage and corresponding electromagnetic field. Also as illustrated, the diode 120A or other exemplary electronic component 120 may further comprise first and second conductors 125 and 130, respectively, which may be formed during fabrication as part of or integrated with the exemplary electronic component 120. The present invention advantageously exploits effects due to the intrinsic voltage, in which a suspended diode 120A or other exemplary electronic component 120 has such an intrinsic voltage and may exhibit a dipole effect. More specifically, when freely suspended and allowed to move (such as within the insulating binder 135), such a dipole will move or rotate in response to an applied electromagnetic field (150), to become parallel (or antiparallel, depending on the polarity) with the applied field 150.

Other types of applied fields 150 may also be utilized, in addition to static or dynamic electrical, magnetic, and/or electromagnetic fields. For example, a sonic field may be utilized to orient certain types of electronic components or particles and bond them to the plurality of first conductors. Other types of radiation, such as uv radiation, or laser light (such as used to provide laser tweezers), may also be used as the applied field 150. Temperature curing and/or bonding may also be utilized, depending on the selected embodiment and the selected electronic components. The strength of the applied field 150 may also be varied, for example, to provide sufficient force to create a sufficient electrical contact between the electronic components and the plurality of first conductors. Also, the orientation of the applied field may be varied, such as to be perpendicular to the channels 105 but parallel to the plane of the substrate 100, for example, depending upon the type of electronic components which are being oriented. The ability of the electronic components such as LEDs 120A to be oriented in a field, such as an electrical field, may also be utilized to differentiate working LEDs 120A from non-working LEDs 120A (which may be defective and not exhibit the dipole effect discussed above).

In addition, in exemplary embodiment, electronic components such as LEDs 120A may be differentially deposited, such as printing a first row/cavity of red LEDs 120A, a second first row/cavity of green LEDs 120A, a third first row/cavity of blue LEDs 120A, a fourth first row/cavity of red LEDs 120A, etc., creating a color dynamic display, as discussed below, with each such LED 120A capable of emitting light of the corresponding color (wavelength), and with each such LED 120A defining a pixel or sub-pixel.

The insulating binder 135 may also include reflective, diffusing or scattering particles, for example, to aid in light transmission in a direction normal to the substrate 100. Also, the electronic components 120 may be any type of micro- or nano-machine or device, in addition to the illustrated diodes and transistors. For example, plasma tubes (used in plasma displays) may be formed, deposited and oriented using the applied field 150.

Accordingly, referring to FIGS. 5, 6 and 7, when the plurality of electronic components 120 (e.g., light-emitting diodes 120A or transistors 120B) in an insulating binder 135 is applied over the plurality of first conductors 110, and the plurality of electronic components 120 are then oriented using an applied field 150 (such as an electrical or magnetic field) as illustrated (with the applied field perpendicular to the plane of the substrate 100), the plurality of electronic components 120 also become oriented in a direction perpendicular to the plane of the substrate 100. Once the plurality of electronic components 120 are aligned or oriented, the insulating binder 135 is then cured, holding the oriented plurality of electronic components 120 in place. With such orientation, the plurality of electronic components 120 make corresponding electrical contacts with the plurality of first conductors 110; the first and second conductors 125 and 130 formed as part of the plurality of electronic components 120 may also facilitate the creation of such electrical contacts with the plurality of first conductors 110. In addition, the creation of such electrical contacts may be further facilitated when the plurality of first conductors 110 have not yet been cured or have only been partially cured, such that the aligned, oriented plurality of electronic components 120 become embedded within the plurality of first conductors 110, followed by curing both the insulating binder 135 and plurality of first conductors 110 with the aligned, oriented plurality of electronic components 120 in place.

In exemplary embodiments, the field 150 may be applied in any of various manners; for example, the applied field may be pulsed initially, such as to help align the plurality of electronic components 120 in the same orientation (e.g., p side adjacent to the plurality of first conductors 110 or n-side adjacent to the plurality of first conductors 110), followed by maintaining the applied field 150 in a comparatively constant manner to stabilize the plurality of electronic components 120 while the insulating binder 135 is cured or otherwise solidified. In an exemplary embodiment, the field 150 is applied substantially uniformly and is substantially constant while the insulating binder 135 is uv cured. A sonic field may also be applied initially with an electric field, followed by discontinuing the sonic field and continuing to apply the electric field 150 substantially uniformly and constantly while the insulating binder 135 is uv cured. In another exemplary embodiment, a DC electric field 150 is applied substantially uniformly and is substantially constant while the insulating binder 135 is non-uv cured, using other wavelengths of electromagnetic radiation, such as within the visible spectrum. In yet another exemplary embodiment, a DC electric field 150 is applied substantially uniformly and is substantially constant while (1) the insulating binder 135 is non-uv cured, using other wavelengths of electromagnetic radiation, such as within the visible spectrum, followed by (2) uv curing, or vice-versa. In another exemplary embodiment, a substantially constant DC electric field 150 is applied substantially uniformly and it provides the curing of the insulating binder 135. In another exemplary embodiment, a substantially constant DC electric field 150 is applied substantially uniformly and it provides the curing of the insulating binder 135, followed by additional curing from an AC electromagnetic field, which may be uv or non-uv wavelengths. Also in an exemplary embodiments, upper and lower electrodes (not separately illustrated) having various shapes may be utilized to create the substantially uniform electric field, such as having the shape of a flat sheet or grate.

The insulating (or dielectric) binder 135, and any second insulating (or dielectric) binder 170, may be comprised of any curable compounded having a reasonably high dielectric constant sufficient to provide electrical insulation between the plurality of first conductors 110 and the plurality of second conductors 140 discussed below. A wide variety of dielectric compounds may be utilized, and all are within the scope of the present invention, and may be included within heat- or uv-curable binders, for example, to form the insulating binder 135, 170. Exemplary dielectric compounds utilized to form the insulating (or dielectric) binder 135 include, without limitation: (1) From Conductive Compounds, a barium titanate dielectric; (2) From DuPont, 5018A Clear UV Cure Ink, 5018G Green UV Cure Ink, 5018 Blue UV Cure Ink, 7153 High K Dielectric Insulator, and 8153 High K Dielectric Insulator; (3) From SunPoly, Inc., 305D UV Curable dielectric ink and 308D UV Curable dielectric ink; and (4) from various suppliers, Titanium Dioxide-filled UV curable inks.

Those having skill in the art will also recognize that various removable or etchable compounds may also be utilized. For example, once the plurality of electronic components 120 have been embedded within or make sufficient electrical contact with the plurality of first conductors 110, have been properly oriented, followed by curing, all or part of the insulating binder 135 may be removed, such as through an acid or ion etching process. Such an etching or washing process may also facilitate providing additional electrical contacts with the plurality of electronic components 120, such as the subsequent formation of electrical contacts with the plurality of second conductors 140 at the corresponding second ends of the plurality of electronic components 120. Following such an etching or washing process, another or additional dielectric binders also may be applied and allowed to cure, depending upon the selected embodiment.

In another variation, the electronic components 120 are suspended in a solvent (instead of the binder 135) and oriented using the applied field. The solvent is then allowed to evaporate, such as through the application of heat, and while the electronic components are still properly oriented, they are bonded to the plurality of first conductors, such as through annealing or other application of heat.

As discussed below with reference to FIG. 26, the ordering between the deposition of the plurality of first conductors and the deposition of the plurality of electronic components in an insulating binder may also be reversed.

FIGS. 8-16 serve to illustrate an additional apparatus embodiment 175C, using cavities 205 (in a substrate 200), which are shaped differently than the cavities 105, and are discussed herein only to the extent that the different shape may require additional or different steps to form the apparatus 175C.

Figure 8:
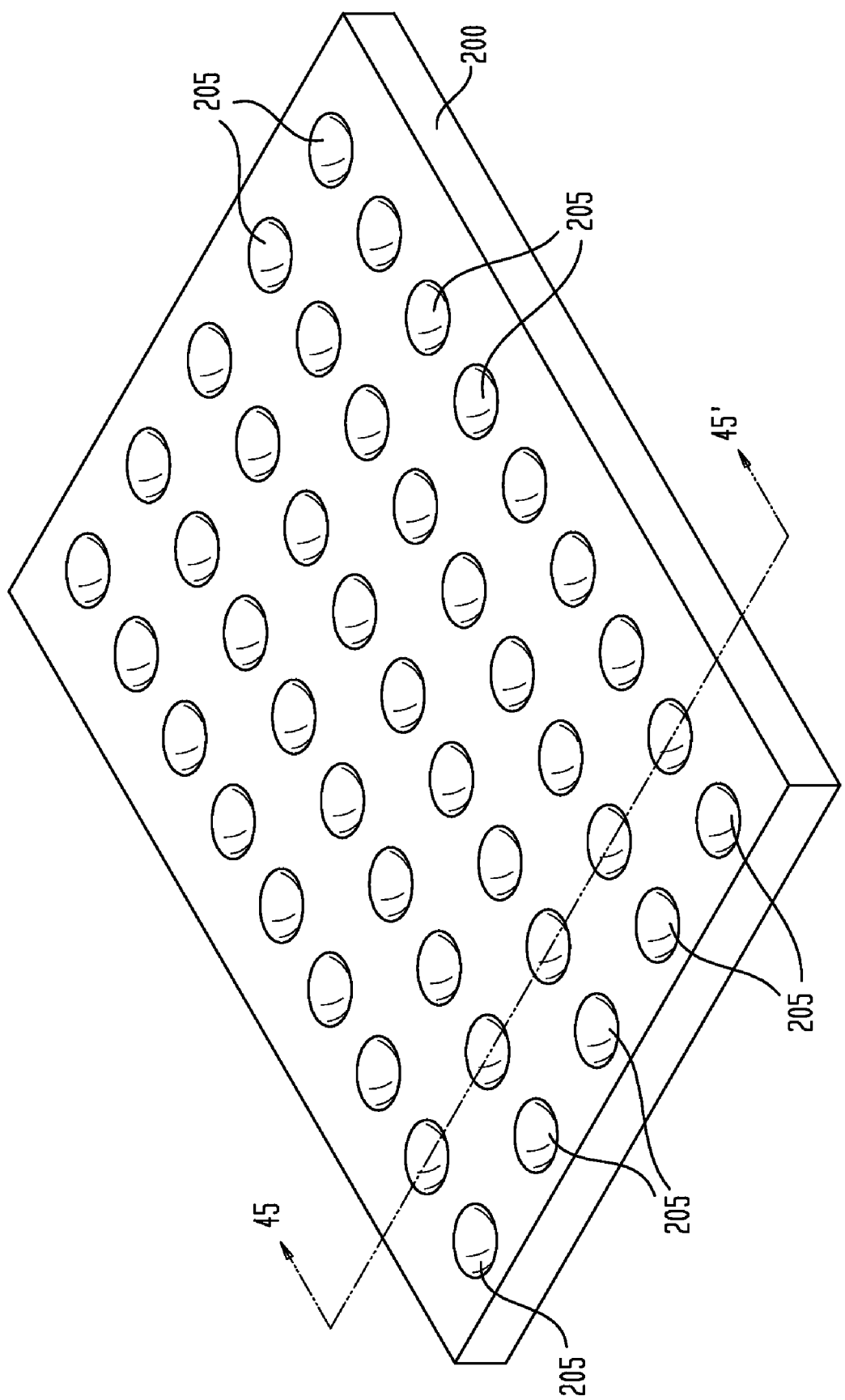
FIG. 8 is a perspective view of a second exemplary substrate for an apparatus embodiment in accordance with the teachings of the present invention.
Figure 9:
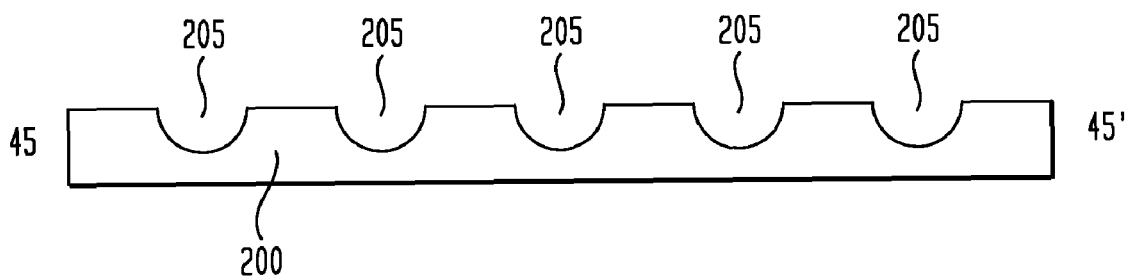
FIG. 9 is a cross-sectional view of the second exemplary substrate for an apparatus embodiment in accordance with the teachings of the present invention.

FIG. 8 is a perspective view of a second exemplary substrate 200 for an apparatus embodiment in accordance with the teachings of the present invention. FIG. 9 is a cross-sectional view (through the 45-45' plane) of the second exemplary substrate 200 for an apparatus embodiment in accordance with the teachings of the present invention. As illustrated, the substrate 200 differs from the substrate 100 only insofar as the plurality of cavities 105, 205 are shaped differently. The substrate 200 has substantially circular or hemi-spherical shaped depressions, dimples or bores, illustrated as cavities 205, rather than elongated channels or grooves. For example, the cavities 205 may be partially spherically-shaped (e.g., a quarter or an eighth of a sphere) and arranged in a Cartesian array.

Figure 11:
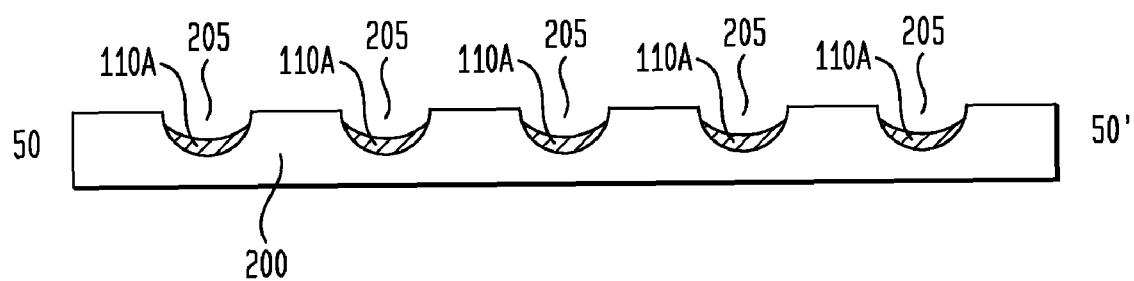
FIG. 11 is a cross-sectional view of the second exemplary substrate with a plurality of first conductors for an apparatus embodiment in accordance with the teachings of the present invention.

FIG. 10 is a perspective view of a second exemplary substrate 200 with a plurality of first conductors 110A having been deposited for an apparatus embodiment in accordance with the teachings of the present invention. FIG. 11 is a cross-sectional view (through the 50-50' plane) of the second exemplary substrate 200 with a plurality of first conductors 110A for an apparatus embodiment in accordance with the teachings of the present invention. As discussed above, the plurality of first conductors 110A may be formed identically to the plurality of first conductors 110, using identical or similar compounds and methods. Rather than forming a series of "wires" however, each of the plurality of first conductors 110A forms an individual conductive "dot" or substantially-circularly shaped conductor.

Figure 13:
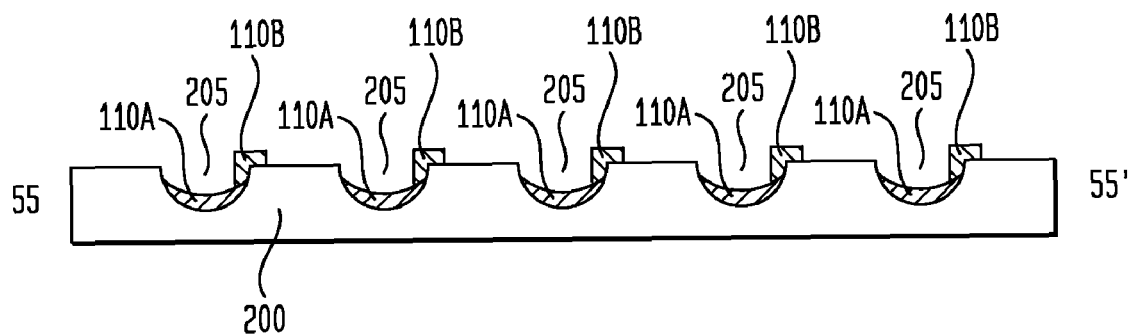
FIG. 13 is a cross-sectional view of the second exemplary substrate with a plurality of first conductors having been deposited for an apparatus embodiment in accordance with the teachings of the present invention.
Figure 12:
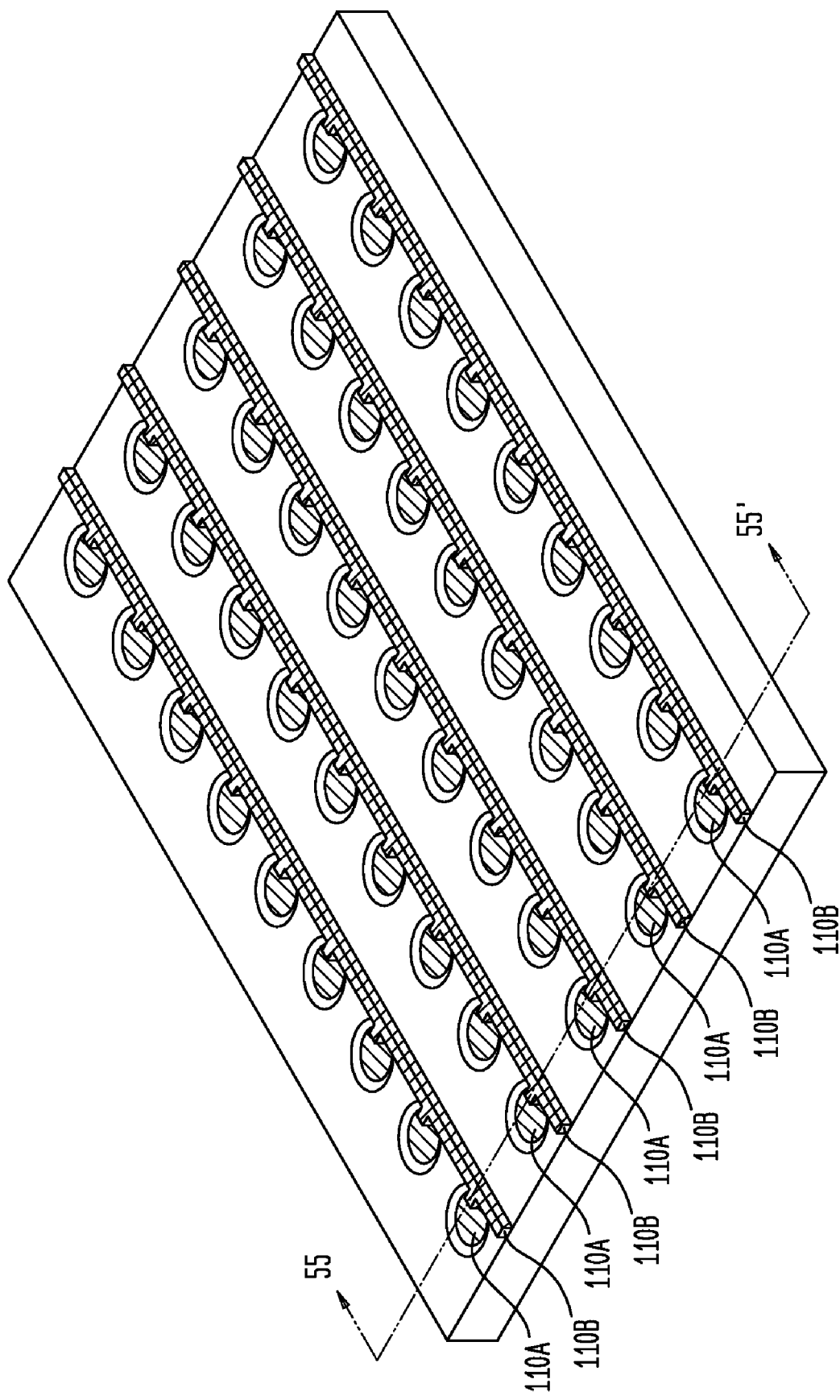
FIG. 12 is a perspective view of a second exemplary substrate with a plurality of first conductors having been deposited for an apparatus embodiment in accordance with the teachings of the present invention.

FIG. 12 is a perspective view of a second exemplary substrate 200 with a plurality of first conductors 110A and 110B having been deposited for an apparatus embodiment in accordance with the teachings of the present invention. FIG. 13 is a cross-sectional view (through the 55-55' plane) of the second exemplary substrate 200 with a plurality of first conductors 110A and 110B having been deposited for an apparatus embodiment in accordance with the teachings of the present invention. As mentioned above, FIGS. 10-13 illustrate the deposition of the plurality of first conductors 110 in two steps, as the plurality of first conductors 110A and 110B. The plurality of first conductors 110B are deposited to make electrical contact with the plurality of first conductors 110A, e.g., forming or providing leads to the plurality of first conductors 110A, and are shaped to form elongated or "wire" shaped conductors, to provide access to the plurality of first conductors 110A to and from the more peripheral sections of the substrate 200. The plurality of first conductors 110B then allow electrical conduction to the plurality of first conductors 110A, and subsequently to electronic components 120.

Alternatively, the plurality of first conductors 110 may be deposited in one step in this embodiment. For example, the plurality of first conductors 110 may be printed using a conductive ink, as illustrated for plurality of first conductors 110B, with a portion allowed to flow or drip into the cavities 205 to form the plurality of first conductors 110A.

Figure 14:
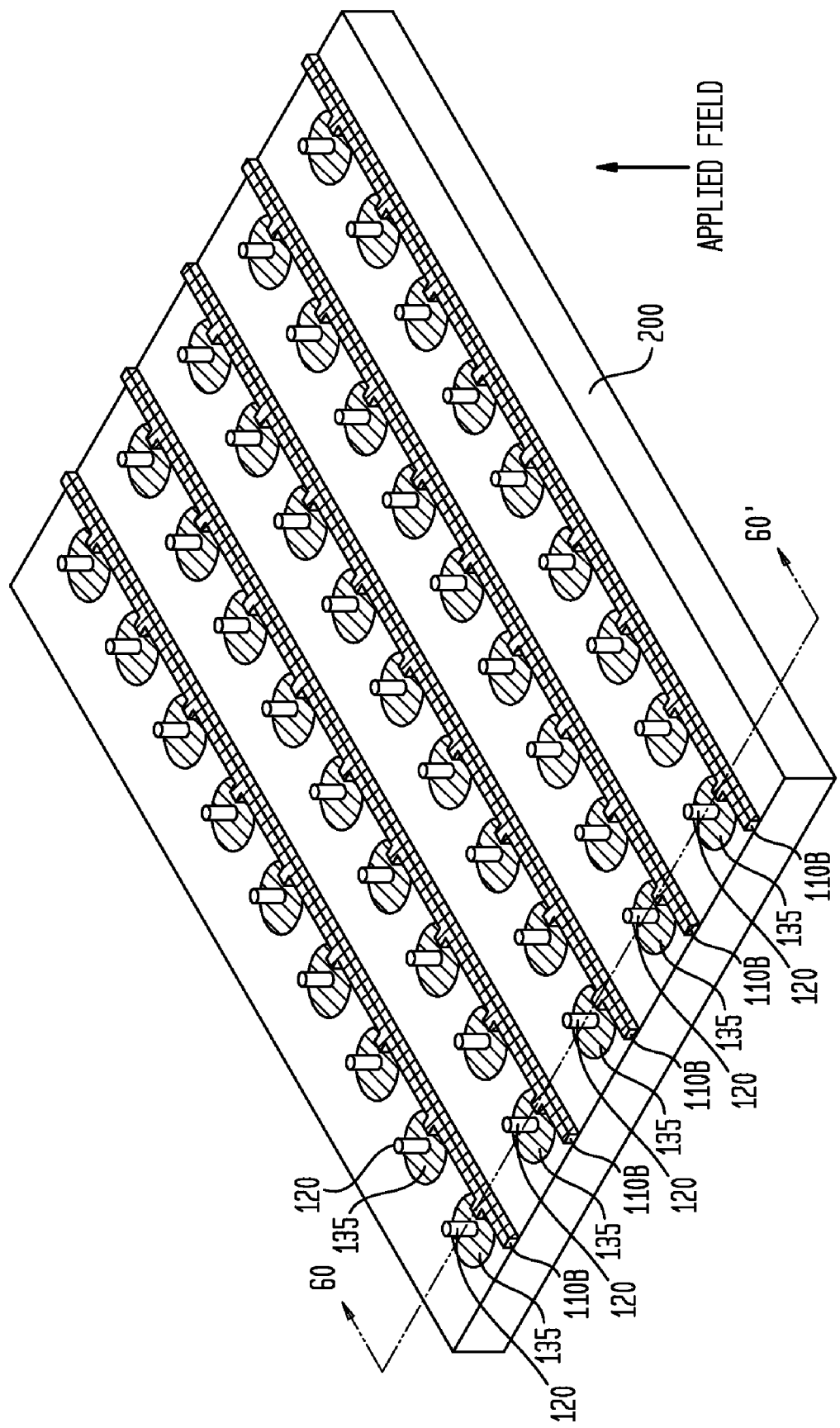
FIG. 14 is a perspective view of a second exemplary substrate with a plurality of first conductors and a plurality of electronic components having been deposited for an apparatus embodiment in accordance with the teachings of the present invention.
Figure 15:
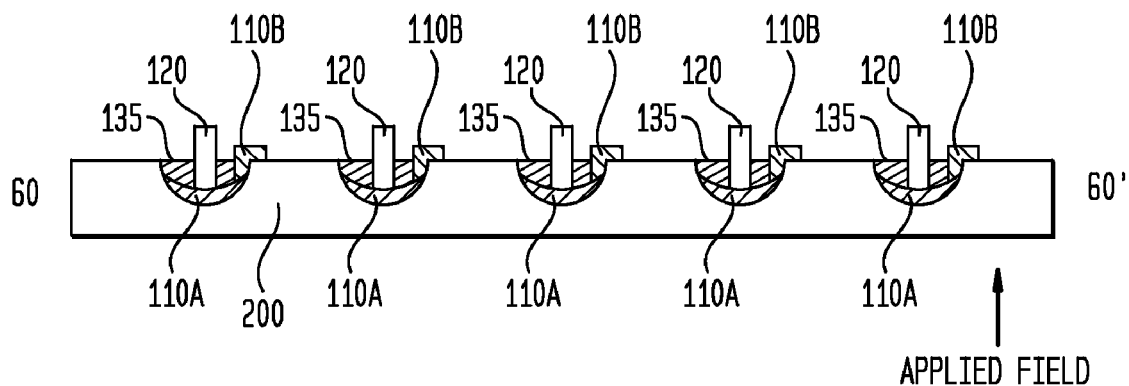
FIG. 15 is a cross-sectional view of the second exemplary substrate with a plurality of first conductors and a plurality of electronic components having been deposited for an apparatus embodiment in accordance with the teachings of the present invention.

FIG. 14 is a perspective view of a second exemplary substrate 200 with a plurality of first conductors 110A and 110B and a plurality of electronic components 120 having been deposited for an apparatus embodiment in accordance with the teachings of the present invention. FIG. 15 is a cross-sectional view (through the 60-60' plane) of the second exemplary substrate 200 with a plurality of first conductors 110A and 110B and a plurality of electronic components 120 having been deposited for an apparatus embodiment in accordance with the teachings of the present invention. The plurality of electronic components 120 may be deposited, oriented and cured in an insulating (or dielectric) binder 135 as previously discussed.

Figure 16:
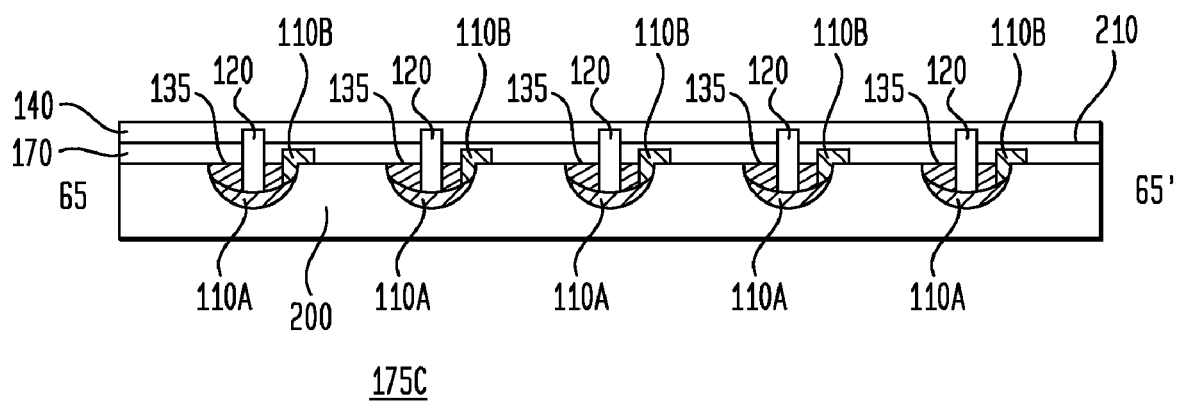
FIG. 16 is a first cross-sectional view of a second exemplary apparatus embodiment in accordance with the teachings of the present invention.
Figure 18:
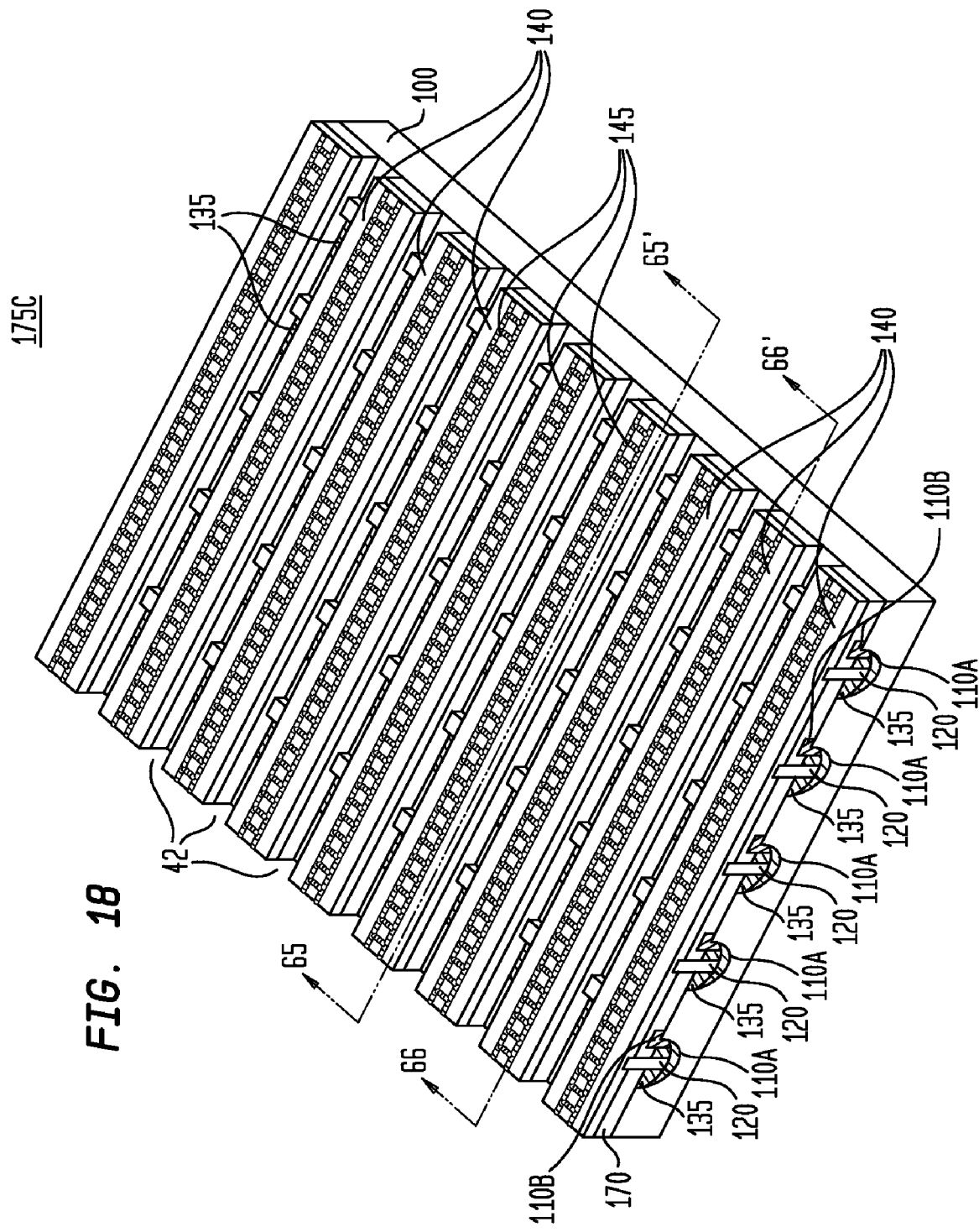
FIG. 18 is a perspective view of a second exemplary apparatus embodiment in accordance with the teachings of the present invention.
Figure 21:
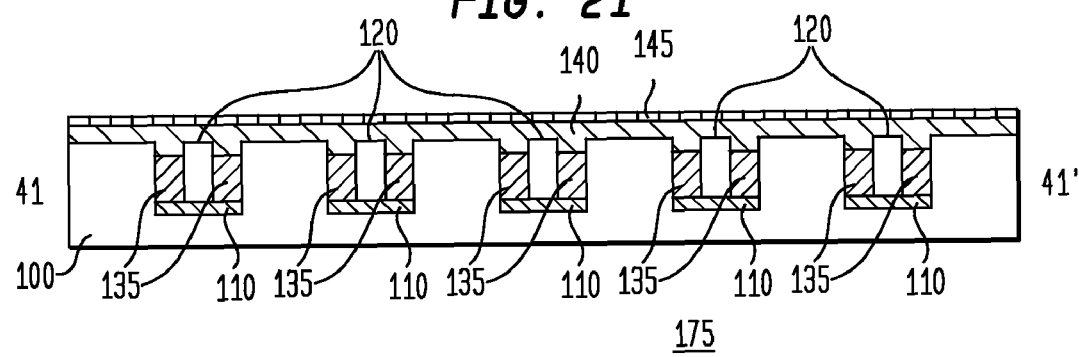
FIG. 21 is a second cross-sectional view of the first exemplary apparatus embodiment in accordance with the teachings of the present invention.
Figure 22:
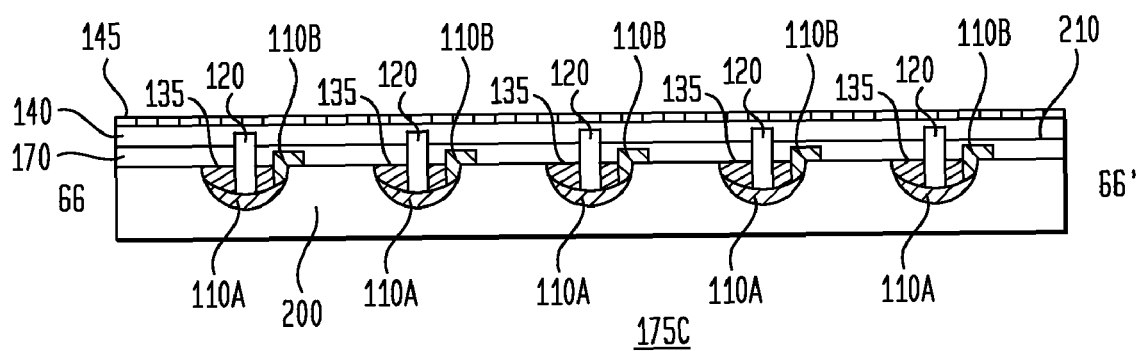
FIG. 22 is a second cross-sectional view of a second exemplary apparatus embodiment in accordance with the teachings of the present invention.

FIG. 18 is a perspective view of a second exemplary apparatus embodiment in accordance with the teachings of the present invention. FIG. 16 is a first cross-sectional view (through the 65-65' plane) and FIG. 22 is a second cross-sectional view (through the 66-66' plane) of a second exemplary apparatus embodiment in accordance with the teachings of the present invention, and are similar to the cross-sectional views of FIGS. 20 and 21, discussed below. It should be noted, however, that because the plurality of first conductors 110B are exposed in FIGS. 14 and 15, rather than confined within a channel-shaped cavity 105, a second insulating layer 170 has been applied over the plurality of first conductors 110B, such as through a printing or coating process, prior to deposition of a plurality of second conductors 140 or a single second conductor 140 (e.g., a second conductive layer). In addition, the second insulating layer 170 may be comprised of any of the insulating or dielectric compounds previously discussed.

Figure 17:
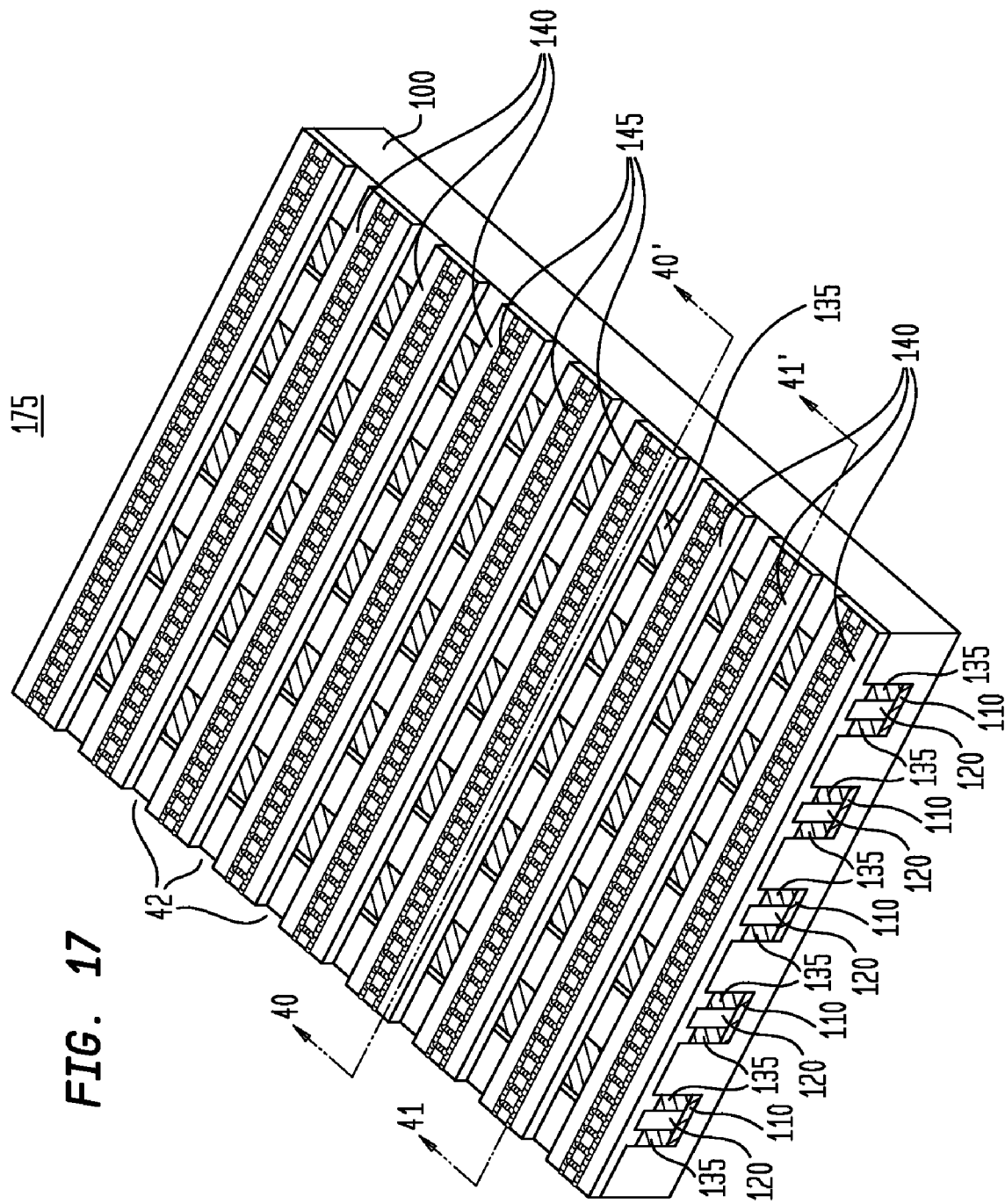
FIG. 17 is a perspective view of a first exemplary apparatus embodiment in accordance with the teachings of the present invention.
Figure 20:
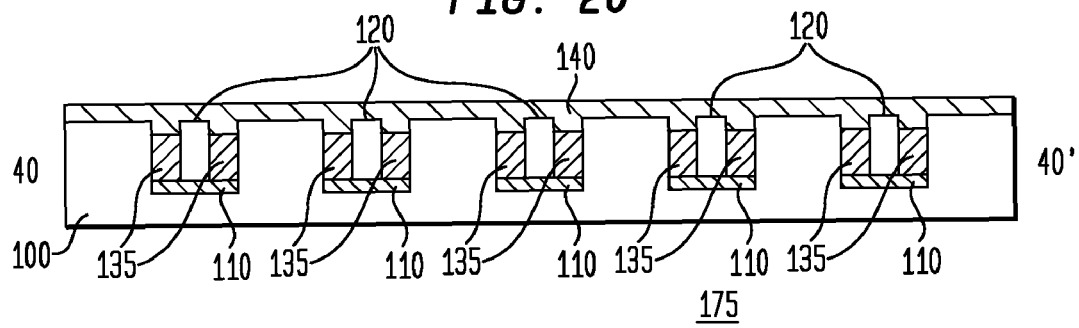
FIG. 20 is a first cross-sectional view of the first exemplary apparatus embodiment in accordance with the teachings of the present invention.

FIG. 17 is a perspective view of a first exemplary apparatus embodiment 175 in accordance with the teachings of the present invention. FIG. 20 is a first cross-sectional view (through the 40-40' plane) and FIG. 21 is a second cross-sectional view (through the 41-41' plane) of the first exemplary apparatus embodiment in accordance with the teachings of the present invention. FIG. 19 is a perspective view of a third exemplary apparatus embodiment 275 in accordance with the teachings of the present invention. FIG. 27 is a first cross-sectional view (through the 70-70' plane) and FIG. 28 is a second cross-sectional view (through the 71-71' plane) of the third exemplary apparatus embodiment in accordance with the teachings of the present invention.

Referring to FIGS. 16-28, following orientation of the plurality of electronic components 120 and curing of the supporting and stabilizing insulating binder 135, and following deposition of an additional insulating layer(s) (e.g., 170, discussed above), an optically transmissive (or transparent) second conductor 140 is applied. Such a transmissive second conductor 140 may be applied as a single electrode to form a static or regional display, or for lighting applications, as illustrated in FIG. 19, or as a plurality of second conductors 140 (as illustrated in FIGS. 17 and 18) to form an addressable display. The transmissive second conductor(s) 140 may be comprised of any compound which: (1) has sufficient conductivity to energize selected portions of the apparatus 175, 185, 275 in a predetermined or selected period of time; and (2) has at least a predetermined or selected level of transparency or transmissibility for the selected wavelength(s) of electromagnetic radiation, such as for portions of the visible spectrum. For example, when the present invention is utilized for a static display having a comparatively smaller form factor, the conductivity time or speed in which the transmissive second conductor(s) 140 provides energy across the display to energize the plurality of electronic components 120 is comparatively less significant than for other applications, such as for active displays of time-varying information (e.g., computer displays) or for static displays having a comparatively larger form factor. As a consequence, the choice of materials to form the transmissive second conductor(s) 140 may differ, depending on the selected application of the apparatus 175, 185, 275 and depending upon the utilization of optional one or more third conductors 145 (discussed below).

The one or more transmissive second conductor(s) 140 are applied over exposed portions of the plurality of electronic components 120 (held in place by the insulating binder 135), and any additional insulating layer(s), using a printing or coating process as known or may become known in the printing or coating arts, with proper control provided for any selected alignment or registration. For example, in the various exemplary embodiments discussed below, a plurality of transmissive second conductors 140 is utilized to create multiple, electrically isolated electrodes (individual transparent wires), which may be formed during one or more printing cycles, and which should be properly aligned in comparison with the plurality of first conductors 110, to provide for proper pixel selection using corresponding pixel addressing, as may be necessary or desirable for a selected application. A selected pixel is then formed by the region of overlap between a selected first conductor 110 and a selected second conductor 140, which when energized, provide power to the corresponding electronic component 120 contained therein, such as to cause light emission from a diode 120A. In other applications, such as for static displays or signage, in which the transmissive second conductor 140 may be a unitary sheet as illustrated in FIG. 19, for example, such alignment issues are comparatively less significant.

In the exemplary embodiment of apparatus 175, 185, 275, polyethylene-dioxithiophene (e.g., Orgacon), a polyaniline or polypyrrole polymer, indium tin oxide (ITO) and/or antimony tin oxide (ATO) is utilized to form the transmissive second conductor(s) 140. While ITO or ATO provides sufficient transparency for visible light, its impedance or resistance is comparatively high (e.g., 20 k Ω), generating a correspondingly comparatively high (i.e., slow) time constant for electrical transmission across this layer of the apparatus 175, 185, 275, such as down a corresponding electrode. Other compounds having comparatively less impedance may also be utilized, such as polyethylene-dioxithiophene. As a consequence, in some of the exemplary embodiments, one or more third conductors 145 having a comparatively lower impedance or resistance is or may be incorporated into corresponding transmissive second conductor(s) 140, to reduce the overall impedance or resistance of this layer, decrease conduction time, and also increase the responsiveness of the apparatus 175, 185, 275 to changing information for dynamic displays. As indicated above, for static displays having larger form factors, such one or more third conductors 145 may be utilized to provide more rapid illumination, enabling the energizing of the more central portions of the area to be illuminated, which would otherwise remain non-energized and dark, due to the insufficient conduction of many types of compounds which may be selected for use in the transmissive second conductor(s) 140. This is also significant for illumination in various patterns for larger displays, such as for rapid blinking or sequential illumination of different display regions. For example, to form one or more third conductors 145, one or more fine wires may be formed using a conductive ink or polymer (e.g., a silver ink or a polyethylene-dioxithiophene polymer) printed over corresponding strips or wires of the transmissive second conductor(s) 140, or one or more fine wires (e.g., having a grid pattern) may be formed using a conductive ink or polymer printed over a larger, unitary transparent second conductor 140 in larger displays, to provide for increased conduction speed throughout the transparent second conductor 140.

In an exemplary addressable display embodiment, the one or more third conductors 145 are formed as a series of fine wires using a conductive ink, with one or two wires disposed centrally in the longitudinal axis of each second conductor of the plurality of second conductors 140, and having a width comparable to the separation between each of the second conductors of the plurality of second conductors 140. In this embodiment, an illuminated region may have a visual appearance of two illuminated pixels, depending upon the selected resolution. In another exemplary embodiment, each of the one or more third conductors 145 may have a "ladder" shape, with two longitudinal wires being connected to each other by perpendicular wires.

Other compounds which may be utilized equivalently to form the transmissive second conductor(s) 140 include indium tin oxide (ITO) as mentioned above, and other transmissive conductors as are currently known or may become known in the art, including one or more of the conductive polymers discussed above, such as polyethylene-dioxithiophene available under the trade name "Orgacon". Representative transmissive conductive materials are available, for example, from DuPont, such as 7162 and 7164 ATO translucent conductor. The transmissive second conductor(s) 140 may also be combined with various binders, such as binders which are curable under various conditions, such as exposure to ultraviolet radiation (uv curable).

Referring again to FIG. 19, as mentioned above, the first conductive medium may be deposited to form a first conductor 110, rather than a plurality of first conductors 110. For example, the first conductor 110 may be printed as a larger, flat electrode over the substrate 100, 200. Similarly, the second conductive medium may be deposited to form a second conductor 140, rather than a plurality of first conductors 140. As an option, one or more third conductors 145 may also be included in this exemplary embodiment. When the first and second conductors are then energized, resulting in the provision of power to the plurality of electronic components such as diodes 120A, the diodes 120A emit light in the visible spectrum. The resulting apparatus 275, therefore, has particular usefulness for lighting applications and for static display applications.

FIG. 27 is a first cross-sectional view (through the 70-70' plane) of the third exemplary apparatus embodiment in accordance with the teachings of the present invention. FIG. 28 is a second cross-sectional view (through the 71-71' plane) of the third exemplary apparatus embodiment in accordance with the teachings of the present invention. As indicated above, the third apparatus utilizes a single first conductor 110 and a single second conductor 140, and optionally may also include one or more third conductors 145 over or within the second conductor 140.

Not separately illustrated in FIGS. 16-28, following deposition of the transmissive second conductor(s) 140 and the optional one or more third conductors 145, various protective coatings may be applied, as indicated in the related applications incorporated herein by reference. For example, the various spaces 42 between the second conductors 140 may be filled in by any of various optically transmissive or opaque materials. In addition, various colors (such as red, green and blue ("RGB")) may be overprinted, defining colored pixels over each of the plurality of electronic components 120. In another alternative, such as when light-emitting diodes 120A are utilized, the various LEDs 120A may be selected to provide corresponding colors, such as corresponding RGB colors, and printed and aligned to form corresponding pixels.

When one or more of the plurality of first conductors 110 and one or more of the plurality of transmissive second conductor(s) 140 (and the optional one or more third conductors 145) are energized, such as through the application of a corresponding voltage, energy will be supplied to each of the electronic components 120 (e.g., LEDs 120A) at the corresponding intersections (overlapping areas) of the energized first conductors 110 and second conductor(s) 140, defining a pixel, for example. Accordingly, by selectively energizing the first conductors 110 and second conductor(s) 140, the apparatus 175, 185 provides a pixel-addressable, dynamic display. For example, the plurality of first conductors 110 may comprise a corresponding plurality of rows, with the plurality of transmissive second conductor(s) 140 (and the optional one or more third conductors 145) comprising a corresponding plurality of columns, with each pixel defined by the intersection or overlapping of a corresponding row and corresponding column. When a second conductor 140 is formed as a unitary sheet, also for example and as illustrated in FIG. 19, energizing of the conductors 110, 140 will provide power to substantially all (or most) of the plurality of electronic components 120, such as to provide light emission for a static display.

Figure 23:
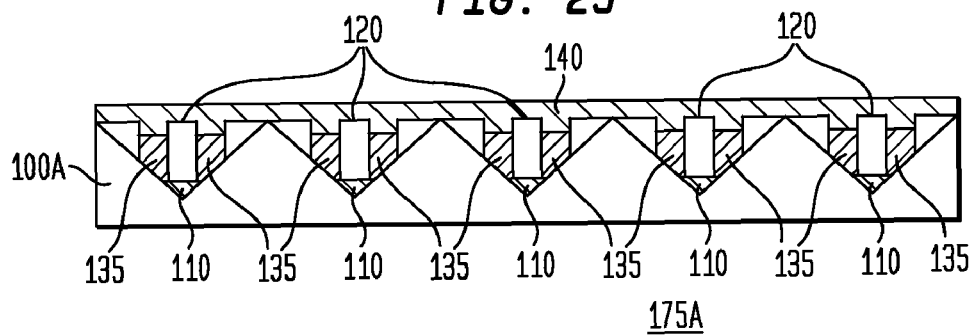
FIG. 23 is a cross-sectional view of a fourth exemplary apparatus embodiment in accordance with the teachings of the present invention.
Figure 24:
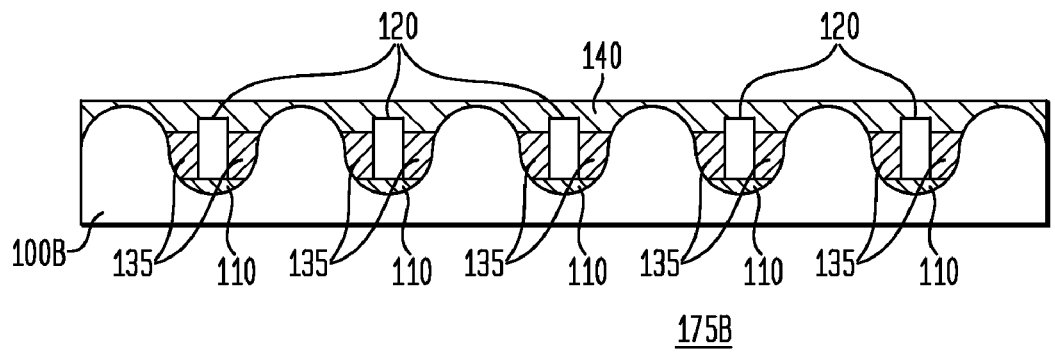
FIG. 24 is a cross-sectional view of a fifth exemplary apparatus embodiment in accordance with the teachings of the present invention.

FIG. 23 is a cross-sectional view of a fourth exemplary apparatus embodiment 175A in accordance with the teachings of the present invention. FIG. 24 is a cross-sectional view of a fifth exemplary apparatus embodiment 175B in accordance with the teachings of the present invention. FIGS. 23 and 24 illustrate apparatuses with substrates 100A and 100B, respectively, having different shapes or forms of cavities 105 and ridges/peaks 115, such as triangular or curvilinear channels or grooves, for example.

Figure 25:
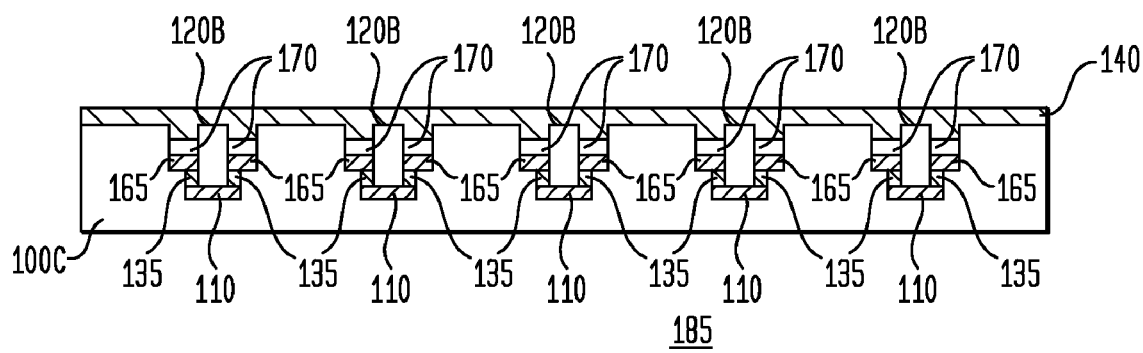
FIG. 25 is a cross-sectional view of a sixth exemplary apparatus embodiment in accordance with the teachings of the present invention.

FIG. 25 is a cross-sectional view of a sixth exemplary apparatus embodiment 185 in accordance with the teachings of the present invention. The apparatus 185 differs from the apparatus 175 insofar as the corresponding electronic components 120B are three-terminal components, such as transistors (BJTs or FETs), rather than two-terminal components (such as LEDs 120A). For such an exemplary embodiment, additional conductors are utilized, such as fourth conductors 165, with an additional insulating layer 170, as illustrated. These additional, respective conducting and insulating elements also may be formed through the printing and coating processes discussed above, as additional steps.

Figure 26:
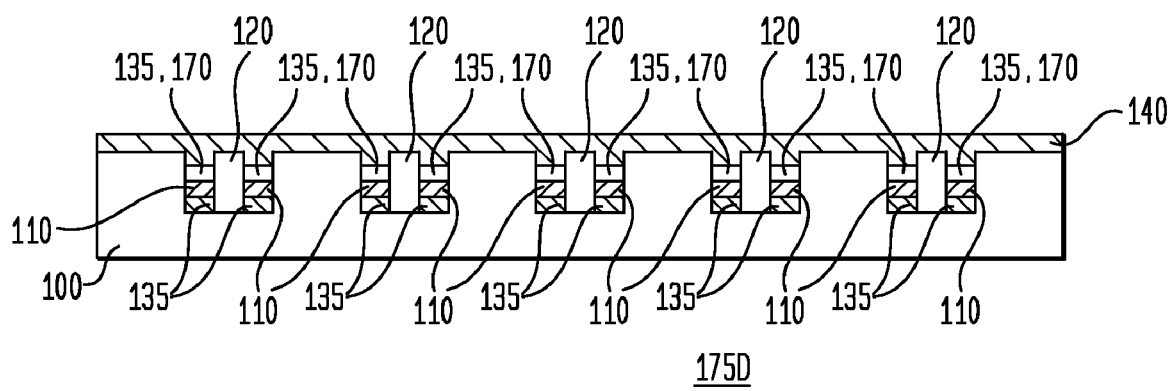
FIG. 26 is a cross-sectional view of a seventh exemplary apparatus embodiment in accordance with the teachings of the present invention.

FIG. 26 is a cross-sectional view of a seventh exemplary apparatus embodiment 175D in accordance with the teachings of the present invention. As previously discussed, the ordering between the deposition of the plurality of first conductors 110 and the deposition of the plurality of electronic components 120 in an insulating binder 135 may also be reversed. As illustrated in FIG. 26, the plurality of electronic components 120 in an insulating binder 135 may be deposited into the channels 105 first, then oriented and cured as discussed above. Then, the plurality of first conductors 110 may be formed, such as by printing and curing a conductive ink about or around the electronic components.

FIG. 29 is a block diagram illustrating a system embodiment 300 in accordance with the teachings of the present invention. The system 300 includes an apparatus 175, 185 (such as an addressable display), with the various pluralities of first conductors 110 and the plurality of transmissive second conductor(s) 140 (and the optional one or more third conductors 145) coupled through lines or connectors 310 (which may be in the form of a bus) to control bus 315, for coupling to controller (or, equivalently, control logic block) 320, and for coupling to a power source 350, which may be a DC power source (such as a battery or a photovoltaic cell) or an AC power source (such as household or building power). The controller 320 comprises a processor 325, a memory 330, and an input/output (I/O) interface 335.

A "processor" 325 may be any type of controller or processor, and may be embodied as one or more processors 325, adapted to perform the functionality discussed herein. As the term processor is used herein, a processor 325 may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components. As a consequence, as used herein, the term processor should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or $E^2$PROM. A processor (such as processor 325), with its associated memory, may be adapted or configured (via programming, FPGA interconnection, or hard-wiring) to perform the methodology of the invention, such as selective pixel addressing. For example, the methodology may be programmed and stored, in a processor 325 with its associated memory (and/or memory 330) and other equivalent components, as a set of program instructions or other code (or equivalent configuration or other program) for subsequent execution when the processor is operative (i.e., powered on and functioning). Equivalently, when the processor 325 may implemented in whole or part as FPGAs, custom ICs and/or ASICs, the FPGAs, custom ICs or ASICs also may be designed, configured and/or hard-wired to implement the methodology of the invention. For example, the processor 325 may be implemented as an arrangement of processors, controllers, microprocessors, DSPs and/or ASICs, collectively referred to as a "controller" or "processor", which are respectively programmed, designed, adapted or configured to implement the methodology of the invention, in conjunction with a memory 330.

A processor (such as processor 325), with its associated memory, may be configured (via programming, FPGA interconnection, or hard-wiring) to control the energizing of (applied voltages to) the various pluralities of first conductors 110 and the plurality of transmissive second conductor(s) 140 (and the optional one or more third conductors 145), for corresponding control over what information is being displayed. For example, static or time-varying display information may be programmed and stored, configured and/or hard-wired, in a processor 325 with its associated memory (and/or memory 330) and other equivalent components, as a set of program instructions (or equivalent configuration or other program) for subsequent execution when the processor 325 is operative.

The memory 330, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor 325), whether volatile or non-volatile, whether removable or non-removable, including without limitation RAM, FLASH, DRAM, SDRAM, SRAM, MRAM, FeRAM, ROM, EPROM or $E^2$PROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. In addition, such computer readable media includes any form of communication media which embodies computer readable instructions, data structures, program modules or other data in a data signal or modulated signal, such as an electromagnetic or optical carrier wave or other transport mechanism, including any information delivery media, which may encode data or other information in a signal, wired or wirelessly, including electromagnetic, optical, acoustic, RF or infrared signals, and so on. The memory 330 may be adapted to store various look up tables, parameters, coefficients, other information and data, programs or instructions (of the software of the present invention), and other types of tables such as database tables.

As indicated above, the processor 325 is programmed, using software and data structures of the invention, for example, to perform the methodology of the present invention. As a consequence, the system and method of the present invention may be embodied as software which provides such programming or other instructions, such as a set of instructions and/or metadata embodied within a computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, SystemC, LISA, XML, Java, Brew, SQL and its variations, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 325, for example).

The software, metadata, or other source code of the present invention and any resulting bit file (object code, database, or look up table) may be embodied within any tangible storage medium, such as any of the computer or other machine-readable data storage media, as computer-readable instructions, data structures, program modules or other data, such as discussed above with respect to the memory 330, e.g., a floppy disk, a CDROM, a CD-RW, a DVD, a magnetic hard drive, an optical drive, or any other type of data storage apparatus or medium, as mentioned above.

The I/O interface 335 may be implemented as known or may become known in the art, and may include impedance matching capability, voltage translation for a low voltage processor to interface with a higher voltage control bus 315, and various switching mechanisms (e.g., transistors) to turn various lines or connectors 310 on or off in response to signaling from the processor 325. In addition, the I/O interface 335 may also be adapted to receive and/or transmit signals externally to the system 300, such as through hard-wiring or RF signaling, for example, to receive information in real-time to control a dynamic display, for example.

In addition to the controller 320 illustrated in FIG. 29, those of skill in the art will recognize that there are innumerable equivalent configurations, layouts, kinds and types of control circuitry known in the art, which are within the scope of the present invention.

Figure 30:
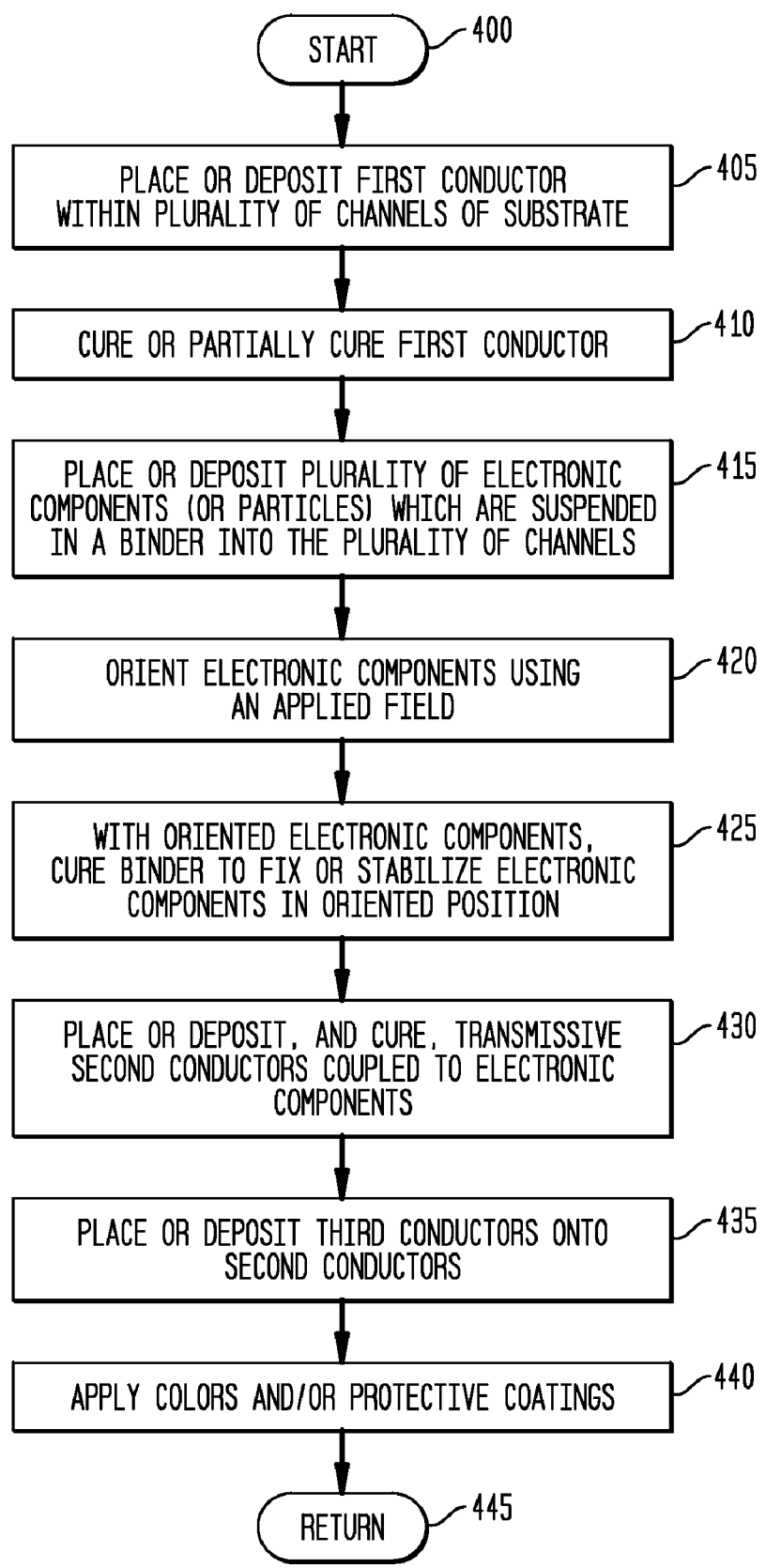
FIG. 30 is a flow chart illustrating a method embodiment in accordance with the teachings of the present invention.

FIG. 30 is a flow chart illustrating a method embodiment in accordance with the teachings of the present invention, for forming or otherwise manufacturing the apparatus 175, 185, and provides a useful summary. Beginning with start step 400, the method deposits a plurality of first conductors within a corresponding plurality of channels of a substrate, step 405, such as by printing a conductive ink, followed by curing or partially curing the conductive ink, step 410. A plurality of electronic components, typically suspended in a binder, are then deposited over the plurality of first conductors in the corresponding channels, step 415. The electronic components are then oriented using an applied field, step 420. With the oriented electronic components, the binder is then cured, resulting in stabilized or fixed electronic components in electrical contact at a first end with the plurality of first conductors, step 425. As an option, additional insulating layers may also be applied. Next, a plurality of transmissive second conductors are then deposited and cured, making electrical contact at a second end with the plurality of electronic components, step 430. In exemplary embodiments, such as for an addressable display, the plurality of transmissive second conductors are oriented substantially perpendicular to the plurality of first conductors. Optionally, a plurality of third conductors are then deposited (and cured) over the corresponding plurality of transmissive second conductors, step 435, followed by any deposition (such as through printing) of selected colors or protective coatings, step 440, and the method may end, return step 445.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

As used herein for purposes of the present invention, the term "LED" and its plural form "LEDs" should be understood to include any electroluminescent diode or other type of carrier injection- or junction-based system which is capable of generating radiation in response to an electrical signal, including without limitation, various semiconductor- or carbon-based structures which emit light in response to a current or voltage, light emitting polymers, organic LEDs, and so on, including within the visible spectrum, or other spectra such as ultraviolet or infrared, of any bandwidth, or of any color or color temperature.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An apparatus, comprising:
   a substantially planar substrate having a plurality of cavities;
   a plurality of first conductors at least partially within the cavities, each first conductor of the plurality of first conductors coupled to the substrate at a bottom of a cavity of the plurality of cavities;
   a plurality of electronic components at least partially within the cavities and coupled to the plurality of first conductors, each electronic component of the plurality of electronic components having a junction substantially perpendicular to the plane of the substrate;
   a plurality of second conductors coupled to the plurality of electronic components; and
   an optically transmissive, electrically insulating material substantially within the plurality of cavities, and for each electronic component of the plurality of electronic components, the optically transmissive, electrically insulating material partially surrounding the electronic component and located substantially and solely between a corresponding first conductor of the plurality of first conductors and a corresponding second conductor of the plurality of second conductors.

2. The apparatus of claim 1, wherein the plurality of electronic components are light emitting diodes.

3. The apparatus of claim 1, further comprising:
   a plurality of third conductors coupled to the plurality of second conductors.

4. The apparatus of claim 1, wherein the substrate is substantially flat and has a thickness of less than two millimeters.

5. The apparatus of claim 1, wherein the substrate is selected from the group consisting of: paper, coated paper, plastic coated paper, embossed paper, fiber paper, cardboard, poster paper, poster board, wood, plastic, rubber, fabric, glass, ceramic, concrete, stone, and combinations thereof.

6. The apparatus of claim 1, wherein the plurality of cavities are substantially elongated.

7. The apparatus of claim 1, wherein the plurality of cavities are at least partially hemispherically-shaped and are disposed in an array.

8. The apparatus of claim 7, wherein the plurality of first conductors further comprise:
   a first portion substantially within a cavity of the plurality of cavities; and
   a second portion substantially elongated and on a surface of the substrate.

9. The apparatus of claim 1, wherein the plurality of first conductors comprise a cured conductive ink or a cured conductive polymer.

10. The apparatus of claim 1, wherein the plurality of first conductors comprise a cured form of a conductor selected from the group consisting of: a silver conductive ink, a copper conductive ink, a gold conductive ink, an aluminum conductive ink, a tin conductive ink, a carbon conductive ink, a conductive polymer, and combinations thereof.

11. The apparatus of claim 1, wherein the plurality of second conductors are substantially optically transmissive.

12. The apparatus of claim 1, wherein the plurality of second conductors comprise an optically transmissive polymer.

13. The apparatus of claim 1, wherein the plurality of second conductors are selected from the group consisting of: antimony tin oxide, indium tin oxide, polyethylene-di-oxithiophene, a carbon-based conductor, and combinations thereof.

14. The apparatus of claim 1, wherein the plurality of electronic components are coupled to the plurality of first conductors by abutment.

15. The apparatus of claim 1, wherein the plurality of electronic components each have an annealed coupling to the plurality of first conductors.

16. The apparatus of claim 1, wherein the plurality of first conductors, the plurality of electronic components and the plurality of second conductors are deposited through a printing process.

17. The apparatus of claim 1 further comprising:
   a plurality of light scattering particles in the optically transmissive, electrically insulating material.

18. The apparatus of claim 1, wherein the plurality of electronic components are diodes.

19. The apparatus of claim 1, wherein the plurality of electronic components are photovoltaic diodes.

20. The apparatus of claim 1, wherein the junction is a pn junction.

21. The apparatus of claim 1, wherein the junction is at least one light emitting junction.

22. The apparatus of claim 1, wherein the substrate is embossed.

23. The apparatus of claim 1, wherein each electronic component of the plurality of electronic components further comprises at least one conductor responsive to an applied electrical or magnetic field during apparatus manufacture.

24. An apparatus, comprising:
   a substantially planar substrate having a plurality of elongated and substantially parallel cavities;
   a plurality of first conductors at least partially within the cavities, each first conductor of the plurality of first conductors coupled to the substrate at a bottom of a cavity of the plurality of cavities;
   a plurality of electronic components coupled to the plurality of first conductors, each electronic component of the plurality of electronic components having a junction substantially perpendicular to the plane of the substrate;
   a second, optically transmissive conductor coupled to the plurality of electronic components, and
   an optically transmissive, electrically insulating material substantially within the cavities, and for each electronic component of the plurality of electronic components, the optically transmissive, electrically insulating material partially surrounding the electronic component and located substantially and solely between a corresponding first conductor of the plurality of first conductors and the second optically transmissive conductor.

25. The apparatus of claim 24, wherein the plurality of electronic components are diodes.

26. The apparatus of claim 24, wherein the plurality of electronic components are light emitting diodes or photovoltaic diodes.

27. The apparatus of claim 24, wherein the junction is a pn junction.

28. The apparatus of claim 24, wherein the junction is at least one light emitting junction.

29. The apparatus of claim 24, further comprising:
a plurality of third conductors coupled to the plurality of second conductors.

30. The apparatus of claim 24 further comprising:
a plurality of light scattering particles in the optically transmissive, electrically insulating material.

31. The apparatus of claim 24, wherein the substrate is substantially flat and has a thickness of less than two millimeters, and wherein the substrate is selected from the group consisting of: paper, coated paper, plastic coated paper, embossed paper, fiber paper, cardboard, poster paper, poster board, plastic, rubber, fabric, and combinations thereof.

32. The apparatus of claim 24, wherein the plurality of first conductors comprise a cured conductive ink or a cured conductive polymer.

33. The apparatus of claim 24, wherein the plurality of second conductors are selected from the group consisting of antimony tin oxide, indium tin oxide, polyethylene-dioxithiophene, a carbon-based conductor, and combinations thereof.

34. The apparatus of claim 24, wherein each electronic component of the plurality of electronic components further comprises at least one conductor responsive to an applied electrical or magnetic field during apparatus manufacture.

35. An apparatus, comprising:
a substantially planar substrate having a plurality of cavities;
a plurality of first conductors at least partially within the cavities, each first conductor of the plurality of first conductors coupled to the substrate at a bottom of a cavity of the plurality of cavities;
a plurality of electronic components coupled to the plurality of first conductors, each electronic component of the plurality of electronic components having a light emitting junction substantially perpendicular to the plane of the substrate;
a second, optically transmissive conductor coupled to an electronic component of the plurality of electronic components; and
an optically transmissive, electrically insulating material substantially within the plurality of cavities, and for each electronic component of the plurality of electronic components, the optically transmissive, electrically insulating material partially surrounding the electronic component and located substantially and solely between a corresponding first conductor of the plurality of first conductors and the second, optically transmissive conductor.

36. The apparatus of claim 35, wherein the plurality of electronic components are light emitting diodes.

37. The apparatus of claim 35, wherein the light emitting junction is a pn junction.

38. The apparatus of claim 35, wherein the light emitting junction is at least one light emitting junction of a plurality of light emitting junctions.

39. The apparatus of claim 35 further comprising:
a plurality of light scattering particles in the optically transmissive, electrically insulating material.

40. The apparatus of claim 35, wherein the substrate is substantially flat and has a thickness of less than two millimeters, and wherein the substrate is selected from the group consisting of: paper, coated paper, plastic coated paper, embossed paper, fiber paper, cardboard, poster paper, poster board, plastic, rubber, fabric, and combinations thereof.

41. The apparatus of claim 35, wherein the plurality of first conductors comprise a cured conductive ink or a cured conductive polymer.

42. The apparatus of claim 35, wherein the plurality of second conductors are selected from the group consisting of: antimony tin oxide, indium tin oxide, polyethylene-dioxithiophene, a carbon-based conductor, and combinations thereof.

43. The apparatus of claim 35, wherein each electronic component of the plurality of light emitting electronic components further comprises at least one conductor responsive to an applied electrical or magnetic field to orient the light emitting junction substantially perpendicular to the plane of the substrate.

44. The apparatus of claim 35, wherein each electronic component of the plurality of light emitting electronic components further comprises at least one conductor responsive to an applied electrical or magnetic field during apparatus manufacture.

* * * * *